US011699474B2

(12) United States Patent
Song et al.

(10) Patent No.: US 11,699,474 B2
(45) Date of Patent: *Jul. 11, 2023

(54) SOT-MRAM WITH SHARED SELECTOR

(71) Applicant: Taiwan Semiconductor Manufacturing Co., Ltd., Hsinchu (TW)

(72) Inventors: MingYuan Song, Hsinchu (TW); Shy-Jay Lin, Jhudong Township (TW); Chien-Min Lee, Hsinchu (TW); William Joseph Gallagher, Ardsley, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/696,394

(22) Filed: Mar. 16, 2022

(65) Prior Publication Data

US 2022/0208244 A1 Jun. 30, 2022

Related U.S. Application Data

(63) Continuation of application No. 17/002,351, filed on Aug. 25, 2020, now Pat. No. 11,289,143.

(Continued)

(51) Int. Cl.
*G11C 11/16* (2006.01)
*G01R 33/09* (2006.01)
(Continued)

(52) U.S. Cl.
CPC ........ *G11C 11/1675* (2013.01); *G01R 33/093* (2013.01); *G11C 11/161* (2013.01); *H10B 61/22* (2023.02); *H10N 50/10* (2023.02); *H10N 50/85* (2023.02); *H10N 52/01* (2023.02); *H10N 52/80* (2023.02)

(58) Field of Classification Search
CPC ... G11C 11/1675; G11C 11/161; G11C 11/18; G11C 11/1659; G11C 11/1655; G11C 11/1657; G01R 33/093; G01R 33/098; H01L 27/228; H01L 43/10; H01L 43/04; H01L 43/14; H01L 43/08
See application file for complete search history.

(56) References Cited

U.S. PATENT DOCUMENTS 8,593,854 B1 11/2013 Chih et al.
8,869,436 B2 10/2014 Tsai et al.
(Continued)

OTHER PUBLICATIONS

Park et al., "Nanoscale 3D Stackable Ag-Doped HfOx-Based Selector Devices Fabricated through Low-Temperature Hydrogen Annealing" ACS Appl. Materials Interfaces Oct. 2019, 8, pp. 29408-29415.
(Continued)

*Primary Examiner* — Tri M Hoang
(74) *Attorney, Agent, or Firm* — Slater Matsil, LLP

(57) ABSTRACT

A magnetic memory device includes a magnetic tunnel junction (MTJ) stack, a spin-orbit torque (SOT) induction wiring disposed over the MTJ stack, a first terminal coupled to a first end of the SOT induction wiring, a second terminal coupled to a second end of the SOT induction wiring, and a shared selector layer coupled to the first terminal.

20 Claims, 36 Drawing Sheets

Related U.S. Application Data

(60) Provisional application No. 62/927,875, filed on Oct. 30, 2019.

(51) Int. Cl.

| | |
|---|---|
| *H01L 27/22* | (2006.01) |
| *H01L 43/04* | (2006.01) |
| *H01L 43/08* | (2006.01) |
| *H01L 43/10* | (2006.01) |
| *H01L 43/14* | (2006.01) |
| *H10B 61/00* | (2023.01) |
| *H10N 50/10* | (2023.01) |
| *H10N 50/85* | (2023.01) |
| *H10N 52/01* | (2023.01) |
| *H10N 52/80* | (2023.01) |

(56) References Cited

U.S. PATENT DOCUMENTS

| | | | |
|---|---|---|---|
| 9,230,623 B2 | 1/2016 | Kim et al. | |
| 9,530,478 B2 * | 12/2016 | Pi | G11C 11/1659 |
| 9,542,987 B2 | 1/2017 | Naik et al. | |
| 9,881,660 B2 | 1/2018 | Yoda et al. | |
| 10,103,199 B2 | 10/2018 | Daibou et al. | |
| 10,147,473 B2 | 12/2018 | Yoda et al. | |
| 10,361,358 B2 | 7/2019 | Abe et al. | |
| 10,381,060 B2 * | 8/2019 | Kan | H01L 27/222 |
| 10,381,551 B1 * | 8/2019 | Lille | H01L 27/222 |
| 10,553,783 B2 * | 2/2020 | Lille | H01L 43/08 |
| 10,600,465 B1 * | 3/2020 | Araki | H01L 27/228 |
| 10,658,021 B1 | 5/2020 | Araki | |
| 10,930,843 B2 * | 2/2021 | Araki | H01L 43/065 |
| 11,069,389 B2 * | 7/2021 | Ohmori | H01L 43/10 |
| 11,276,730 B2 * | 3/2022 | O'Brien | H01L 43/04 |
| 11,374,164 B2 * | 6/2022 | Gosavi | H01L 43/10 |
| 11,417,830 B2 * | 8/2022 | Gosavi | G11C 11/18 |
| 2013/0234094 A1 | 9/2013 | Chang et al. | |
| 2013/0336041 A1 | 12/2013 | Tsai et al. | |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2020/0341079 A1 * | 10/2020 | Swerts | G01R 33/098 |
| 2021/0125654 A1 | 4/2021 | Endoh et al. | |
| 2021/0184105 A1 | 6/2021 | Sasaki et al. | |

OTHER PUBLICATIONS

Shimomura et al., "High-speed Voltage Control Spintronics Memory (VoCSM) Having Broad Design Windows" Symposium on VLSI Circuits Digest of Technical Papers, 2018, Kawasaki, Japan, pp. 83-84.

* cited by examiner

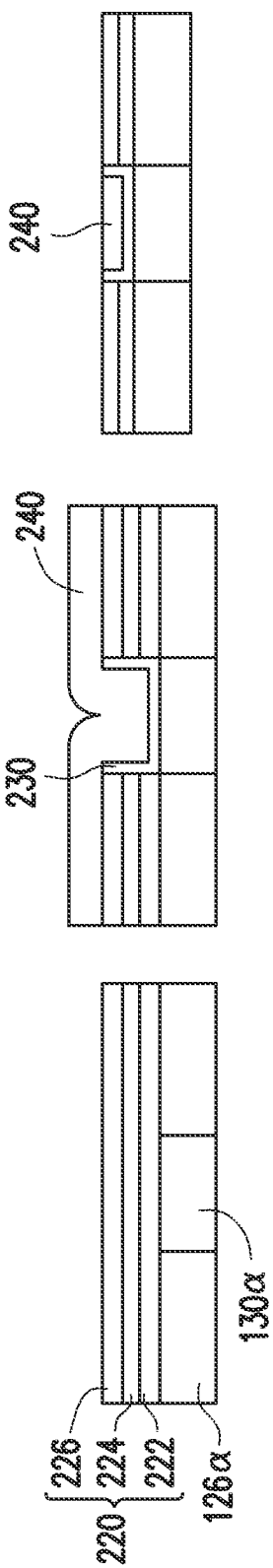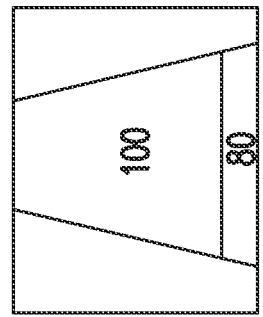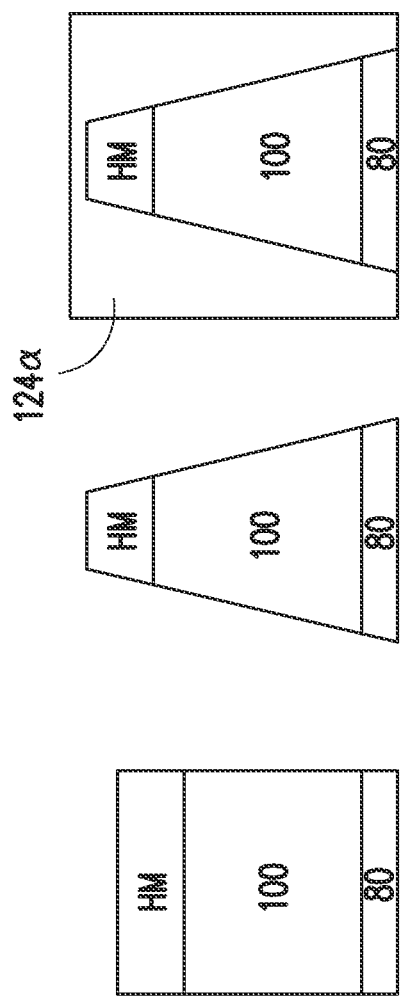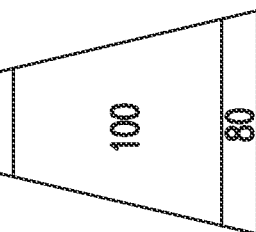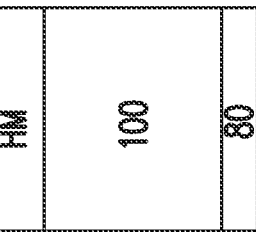

SOT-MRAM WITH SHARED SELECTOR

CROSS-REFERENCE TO RELATED APPLICATION

This application is a continuation of U.S. application Ser. No. 17/002,351, filed on Aug. 25, 2020, now U.S. Pat. No. 11,289,143, issued on Mar. 29, 2022, which claims the benefit of the provisionally filed U.S. Application No. 62/927,875, filed Oct. 30, 2019, and entitled "SOT-MRAM;" which application is hereby incorporated herein by reference

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque magnetic random access memory (STT-MRAM). An STT-MRAM utilizes a magnetic tunneling junction (MTJ) written at least in part by a current driven through the MTJ. Another type of an MRAM is a spin orbit torque MRAM (SOT-MRAM), which generally requires a lower switching current than an STT-MRAM.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 20 through 24, 25A through 25G, 26 through 27, 28A through 28D, 29A through 29B, 30A through 30C, 31 through 32, 33A through 33F, and 34 illustrate intermediate steps in the formation of an SOT-MRAM device according to some embodiments.

DETAILED DESCRIPTION

Figure 1:
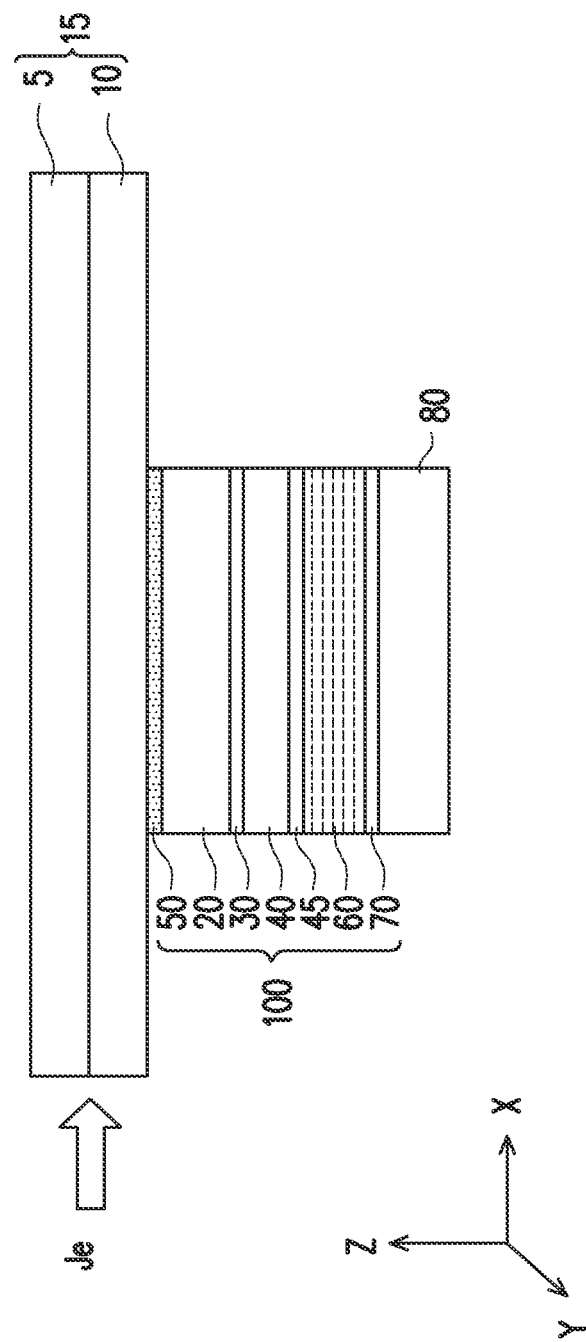
FIG. 1 is a schematic view of an SOT-MRAM cell according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes, and/or operations described with respect to one embodiment may be employed in the other embodiments, and detailed explanation thereof may be omitted.

Embodiments use a shared selector in conjunction with a SOT-MRAM device to control the spin and effective resistance of an MRAM film stack. The shared selector allows for easier manufacture than dedicated selectors for each SOT-MRAM cell. Also, utilizing a shared selector provides reduces complexity and may provide a smaller foot print.

A spin-torque-transfer magnetic random-access memory (STT-MRAM), is one of the next generation memory technologies for CMOS integrated circuits (ICs). However, this fast access applications, such as low-level cache require fast speeds and write speed is much slower than read speed. The cache application for a central processing unit (CPU) and/or a microcontroller (MCU) additionally requires low-power consumption. An STT-RAM, however, takes substantial current to change the magnetization state during the write operation. An STT-MRAM cell generally includes a magnetic tunnel junction (MTJ) film stack having a free magnetic layer, a reference or pinned magnetic layer and a tunnel barrier layer made of a non-magnetic material, such as MgO. The magnetization of the magnetic layers can be either in-plane or perpendicular to the plane. The free layer is the magnetic layer which has two energetically equivalent magnetic states, with the magnetization in the free layer parallel or antiparallel to the magnetization of the reference layer. By applying a current perpendicular to the MTJ film stack, the magnetic orientation (moment) of the free magnetic layer can be changed, thereby writing data to the STT-MRAM cell.

In contrast, spin-orbital-transfer (or spin-orbital-torque) (SOT) magnetic switching has the potential to provide order-of-magnitude improvement on write current and speed. SOT has promising applications for high-speed, low power memory cache.

In an SOT-MRAM, the magnetic moment of the free magnetic layer is switched using the spin-orbit interaction effect caused by a current flowing parallel to the MTJ film stack. The magnetic moment of the free magnetic layer is switched using only the spin-orbit interaction effect, or the magnetic moment of the free magnetic layer is switched using a combination of effects. However, an SOT device structure is a three terminal device and generally requires two switching transistors (a 2T1R (two transistors-one resistor) structure), and thus an SOT-MRAM has a low cell density.

In the present disclosure, a 1T1S1R (one transistor, one selector, and one resistor or MTJ) SOT-MRAM design is provided, which can reduce a device foot print (cell size), reduce magnetic resistance, and increase cell density. Further, embodiment SOT-MRAM designs provide simplified manufacturing techniques including a shared selector which simplifies design and provides cost and manufacturing process savings. The use of a shared selector also allows for wider manufacturing tolerances.

FIG. 1 illustrates a schematic view of the SOT-MRAM function elements of a SOT-MRAM cell 90 (see FIG. 2) according to an embodiment of the present disclosure. These elements include a SOT induction wiring layer 15 and a MTJ film stack 100, where the SOT induction wiring layer serves as a spin-orbit interaction active layer. The MTJ film stack 100 includes a free layer 20 disposed under the SOT induction wiring layer 15, a barrier layer 30 disposed under the free layer 20, and a reference layer 40 disposed under the barrier layer 30. In some embodiments, an interface layer 50, functioning as a keeper layer, is disposed between the SOT induction wiring layer 15 and the free layer 20. Further, the MTJ film stack 100 includes a Synthetic Anti-Ferromagnetic (SAF) layer 60 disposed under the reference layer 40. In some embodiments, a bottom electrode 80 is disposed under the MTJ film stack 100. In some embodiments, a seed layer 70 is formed on the bottom electrode 80. In some embodiments, a spacer layer 45 is disposed between the reference layer 40 and the SAF layer 60. Further, in some embodiments, the SOT induction wiring layer 15 includes a top conductive layer 5, e.g., a top electrode, disposed on a main SOT induction wiring layer 10. The bottom electrode 80 (and the seed layer 70) are described apart from the MTJ film stack 100, however, the bottom electrode 80 and/or the seed layer 70 may be considered part of the MTJ film stack 100 as appropriate.

The magnetic moment of the free layer 20 is switched using the spin-orbit interaction effect. In some embodiments, the magnetic moment of the free layer 20 is switched using only the spin-orbit interaction effect. In other embodiments, the magnetic moment of the free layer 20 is switched using a combination of effects. For example, the magnetic moment of the free layer 20 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The SOT induction wiring layer 15 may include a top conductive layer 5 and a main SOT induction wiring layer 10. The top conductive layer 5 is an electrode that includes one or more layers of Ta, TiN, TaN, Ru, Au, and Al. In embodiments where the MTJ film stack 100 is inverted, the SOT induction wiring layer 15 is also inverted and is underneath the MTJ film stack 100 such that the top conductive layer 5 becomes a bottom conductive layer. In some embodiments, the top conductive layer 5 may be omitted.

The main SOT induction wiring layer 10 is a spin orbit active layer that has a strong spin-orbit interaction and that can be used in switching the magnetic moment of the free layer 20. The main SOT induction wiring layer 10 is used in generating a spin-orbit magnetic field H. More specifically, a current driven in a plane through the main SOT induction wiring layer 10 and the attendant spin-orbit interaction may result in the spin-orbit magnetic field H. This spin orbit magnetic field H is equivalent to the spin-orbit torque T on magnetization, where $T=-\gamma[M \times H]$ in the first magnetic layer 20. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for a current driven in a plane in the main SOT induction wiring layer 10 and a spin-orbit interaction. In contrast, spin transfer torque is due to a perpendicular-to-plane current flowing through the free layer 20, the barrier layer 30 and the reference layer 40, that injects spin polarized charge carriers into the free layer 20. The spin-orbit torque T may rapidly deflect the magnetic moment of the free layer 20 from its equilibrium state parallel to the easy axis. The spin-orbit torque T may tilt the magnetization of the free layer 20 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the free layer 20.

In some embodiments, the interaction of the main SOT induction wiring layer 10 includes the spin Hall effect. For the spin Hall effect, a current Je is driven in the plane of the main SOT induction wiring layer 10 (i.e., current-in-plane, substantially in the x-y plane in FIG. 1). In other words, the current Je is driven perpendicular to the stacked direction of the films including the main SOT induction wiring layer 10 and the free layer 20 (i.e., perpendicular to the normal to the surface, the z-direction in FIG. 1). Charge carriers having spins of a particular orientation perpendicular to the direction of current and to the normal to the surface (z-direction) accumulate at the surfaces of the main SOT induction wiring layer 10. A majority of these spin-polarized carriers diffuse into the free layer 20. This diffusion results in the torque T on the magnetization of the free layer 20. Since torque on the magnetization is equivalent to the effective magnetic field on the magnetization, as set forth above, the spin accumulation equivalently results in the field H on the free layer 20. The spin-orbit field for the spin-Hall effect is the cross product of the spin-orbit polarization and the magnetic moment of the free layer 20. As such, the magnitude of the torque is proportional to the in-plane current density Je and spin polarization of the carriers. The spin-Hall effect may be used in switching the magnetic stacked layer shown in FIG. 1 when the polarization induced by the spin-Hall effect is parallel to the easy axis of the free layer 20. To obtain the spin-orbit torque T, the current pulse is driven in plane through the main SOT induction wiring layer 10. The resulting spin-orbit torque T counteracts damping torque, which results in the switching of the magnetization of the free layer 20 in an analogous manner to conventional STT switching.

The main SOT induction wiring layer 10 is a spin orbit active layer that causes a strong spin orbit interaction with the free layer 20. In some embodiments, the main SOT induction wiring layer 10 includes one or more heavy metals or materials doped by heavy metals. In certain embodiments, Pt, α-W, β-W, β-Ta, AuPt, $W_3Ta$, $Bi_xSe_y$, BiSeTe, multi-layers thereof, alloys thereof, the like, or combinations thereof is used for the material of the main SOT induction wiring layer 10. The thickness of the main SOT induction wiring layer 10 may be between about 1 nm to 20 nm in some embodiments, such as between about 5 nm to 15 nm, such as about 5 nm. In some embodiments, an antiferromagnetic layer made of, for example, IrMn, is disposed between the main SOT induction wiring layer 10 and the top conductive layer 5. In some embodiments, the thickness of main SOT induction wiring layer 10 may be optimized for the composition or other characteristics of the main SOT induction wiring layer 10. For example, the use of a thicker main SOT induction wiring layer 10 can increase the spin polarized current that is generated, but spin diffusion can also reduce the efficiency of thicker main SOT induction wiring layer 10. The amount of spin diffusion in the main SOT induction wiring layer 10 can depend on the spin diffusion length of the material of the main SOT induction wiring layer 10. In this manner, the thickness of the main SOT induction wiring layer 10 can be chosen to maximize performance of the SOT-MRAM cell 90 (see FIG. 2) for a given application and a given material used for the main SOT induction wiring layer 10.

The free layer 20 is a data storage layer having a magnetic moment that is switchable. Within the MTJ film stack 100 of a SOT-MRAM cell 90, the free layer 20 acts as a state-keeping layer, and its magnetic state determines the state of the SOT-MRAM cell 90. For example, the magnetic moment of the free layer 20 is controllable (e.g., by controlling a current flowing in the SOT induction wiring layer 15), and by controlling the magnetic moment of the free layer 20 in this manner, the resistance of the SOT-MRAM cell 90 may be put in a high-resistance state or a low-resistance state. Whether the SOT-MRAM cell 90 is in a high-resistance state or a low-resistance state depends on the relative orientations of the spin polarizations of the free layer 20 and the reference layer 40 (see below for more detail on the reference layer 40).

The free layer 20 may be formed of one or more ferromagnetic materials, such as cobalt iron boron (CoFeB), cobalt/palladium (CoPd), cobalt iron (CoFe), cobalt iron born tungsten (CoFeBW), nickel iron (NiFe), Ru, alloys thereof, the like, or combinations thereof. The free layer 20 may include multiple layers of different materials, such as a layer of Ru between two layers of CoFeB, though other configurations of layers or materials may be used. In some embodiments, the material of the free layer 20 includes a crystalline material deposited to have a particular crystalline orientation, such as a (100) orientation. The thickness of the free layer 20 may be between about 0.4 nm and about 4 nm. In some embodiments, a free layer 20 having an in-plane magnetic anisotropy (IMA) may have a thickness between about 1.3 nm and about 4 nm, or a free layer 20 having a perpendicular-to-plane magnetic anisotropy (PMA) may have a thickness between about 0.4 nm and about 1.3 nm. A suitable thickness of the free layer 20 may be determined by the composition of the free layer 20 or the magnetic properties of the free layer 20.

In some embodiments, the barrier layer 30 is formed of one or more materials such as MgO, AlO, AlN, $SrTiO_3$, the like, or combinations thereof. In some embodiments, the material of the barrier layer 30 includes a crystalline material deposited to have a particular crystalline orientation, such as a (100) orientation. The material of the barrier layer 30 may be deposited to have the same crystalline orientation as the free layer 20. In some embodiments, the barrier layer 30 may have a thickness between about 0.3 nm and about 3 nm, such as about 1 nm. In some cases, controlling the thickness of the barrier layer 30 may control the resistance ($R_{MTJ}$) of the MTJ film stack 100. For example, a thicker barrier layer 30 may increase the resistance of the MTJ film stack 100. In some embodiments, performance of a SOT-MRAM cell 90 can be improved by controlling the resistance $R_{MTJ}$ of the MTJ film stack 100 to match the parasitic resistance of the circuit(s) connected to the SOT-MRAM cell 90. In some cases, matching the resistances in this manner can increase the ranges of operational conditions over which the SOT-MRAM cell 90 can be read. The barrier layer 30 may be thin enough such that electrons are able to tunnel through the barrier layer 30.

The reference layer 40 is second magnetic layer of which the magnetic moment does not change. The reference layer 40 may be made of any of the same materials as the free layer 20 as set forth above, and may have the same material composition as the free layer 20. In some embodiments, the reference layer 40 includes one or more layers of magnetic materials. In some embodiments, the reference layer 40 includes a layer of a combination of cobalt (Co), iron (Fe), and boron (B), such as Co, Fe, and B; Fe and B; and so forth. In some embodiments, the material of the reference layer 40 includes a crystalline material deposited to have a particular crystalline orientation, such as a (100) orientation. The material of the reference layer 40 may be deposited to have the same crystalline orientation as the barrier layer 30. In some embodiments, a thickness of the reference layer 40 is in a range from about 0.2 nm to about 2.5 nm, such as between about 1.0 nm to about 1.5 nm.

Some embodiments may include a spacer layer 45 interposed between the reference layer 40 and the Synthetic Anti-Ferromagnetic (SAF) layer 60 (see below for a detailed description of the SAF layer 60). The spacer layer 45 may be an anti-ferromagnetic layer. In such embodiments, the spacer layer 45 is formed of a material such as Ru, W, Mo, Ir, the like, or combinations thereof. In some embodiments, the spacer layer 45 may have a thickness between about 2 Å and about 10 Å. In some embodiments, a thicker spacer layer 45 may be used to reduce the effects of crystalline lattice mismatch on the SAF layer 60 from overlying layers. The spacer layer 45 may be thin enough such that electrons are able to tunnel through the spacer layer 45.

The SAF layer 60 is a hard bias layer used to pin the spin polarization direction of the reference layer 40 in a fixed direction. Pinning the spin polarization direction of the reference layer 40 allows the SOT-MRAM cell 90 to be toggled between a low-resistance state and a high-resistance state by changing the spin polarization direction of the free layer 20 relative to the reference layer 40. Because the free layer 20 is formed over the reference layer 40 and the SAF layer 60, the example MTJ film stack 100 shown in FIG. 2 may be considered a "bottom-pinned" MTJ stack. In some embodiments, however, the order of the layers of the MTJ film stack 100 may be reversed and the SOT induction wiring layer 15 formed under the MTJ film stack 100. In such embodiments, because the SAF layer 60 and the reference layer 40 are formed over the free layer 20, such an MTJ stack may be considered a "top-pinned" MTJ stack.

The SAF layer 60 may include multiple layers of different materials, in some embodiments. For example, the SAF layer 60 may comprise a stack of one or more ferromagnetic layers and one or more non-magnetic layers. For example, the SAF layer 60 may be formed from a non-magnetic layer sandwiched between two ferromagnetic layers or may be a stack of alternating non-magnetic layers and ferromagnetic layers. The ferromagnetic layers may be formed of a material such as Co, Fe, Ni, CoFe, NiFe, CoFeB, CoFeBW, alloys thereof, the like, or combinations thereof. The non-magnetic layers may be formed of material such as Cu, Ru, Ir, Pt, W, Ta, Mg, the like, or combinations thereof. In some embodiments, the ferromagnetic layer(s) of the SAF layer 60 may have a thickness between about 1 nm and about 3 nm. In some embodiments, a thicker SAF layer 60 may have stronger antiferromagnetic properties, or may be more robust against external magnetic fields or thermal fluctuation. In some embodiments, the non-magnetic layer(s) of the SAF layer 60 may have a thickness between about 2 Å and about 10 Å. For example, the SAF layer 60 may include a layer of Ru that has a thickness of about 4 Å or about 8.5 Å, though other layers or thicknesses are possible. In some embodiments, one or more layers of the SAF layer 60 includes a crystalline material deposited to have a particular crystalline orientation, such as a (111) orientation. In some embodiments, a total thickness of the SAF layer 60 is in a range from about 3 nm to about 10 nm, such as about 5 nm.

In some embodiments, the seed layer 70 includes Ta. In some embodiments, the bottom electrode 80 includes Ti, TiN, Ta and/or TaN. In some embodiments, a CoHf buffer layer is disposed between the SAF layer 60 and the bottom electrode 80.

The optional interface layer 50 may include at least one of an MgO layer and a Co layer in some embodiments. The interface layer 50 can reduce or minimize the magnetic interference between the free layer 20 and the main SOT induction wiring layer 10, while maintaining magnetic coupling thereof.

Figure 2:
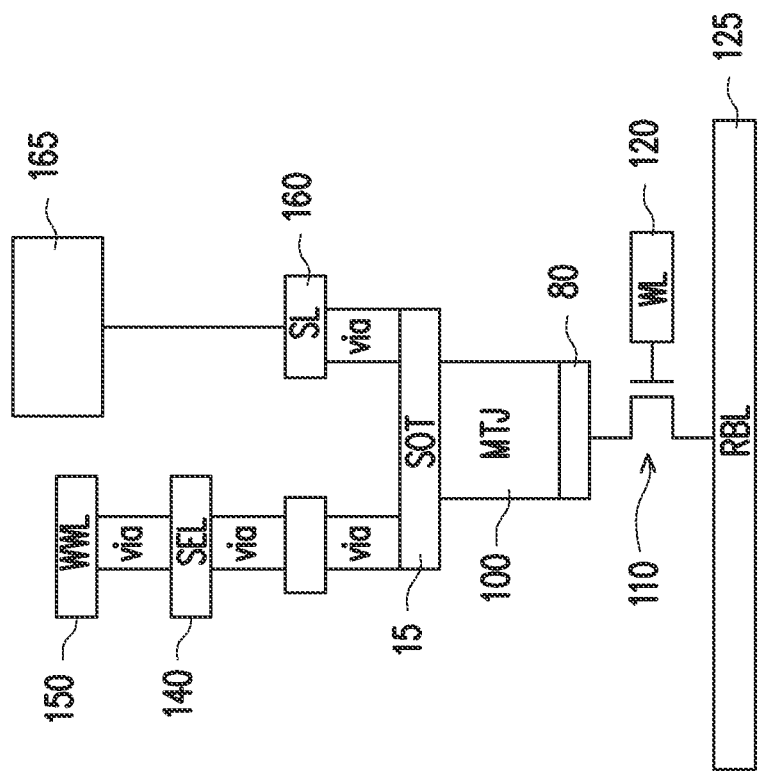
FIG. 2 is a schematic view of an SOT-MRAM cell according to some embodiments.

FIG. 2 shows a schematic view of a SOT-MRAM cell 90 according to an embodiment of the present disclosure. Materials, configurations, dimensions, processes, and/or operations described with respect to FIG. 1 using like references may be employed in the following embodiments, and detailed explanation thereof may be omitted.

In some embodiments, the bottom electrode 80 is coupled to a switching device (e.g., a field effect transistor (FET)), referred to herein as FET 110. In some embodiments, the bottom electrode 80 is coupled to a drain (or source) of the FET 110 through one or more conductive patterns, such as a via, a wiring and/or a pad, and a gate of the FET is coupled to a word line WL 120. A source (or drain) of the FET 110 is coupled to a read bit line RBL 125 through one or more conductive patterns, such as a via, a wiring and/or a pad.

In some embodiments, the SOT induction wiring layer 15 is disposed over the MTJ film stack 100 along the vertical direction (film stack direction) (Z direction). One end of the SOT induction wiring layer 15 is coupled to the bottom of a selector layer 140 through one or more conductive patterns, such as a via, a wiring and/or a pad. The other end of the SOT induction wiring layer 15 is coupled to a source line SL 160 through one or more conductive patterns, such as a via, a wiring and/or a pad. The source line 160 is coupled to a current source circuit 165 in some embodiments. The top of the selector layer 140 is coupled to a write word line WWL 150 through one or more conductive patterns, such as a via, a wiring and/or a pad.

In some embodiments, the MTJ film stack 100 is inverted, the bottom electrode 80 becoming a top electrode, and the SOT induction wiring layer 15 disposed over the MTJ film stack 100, with the main SOT induction wiring layer 10 being interposed between the MTJ film stack 100 and the top conductive layer 5 (which is now on the bottom). In such embodiments, the wiring arrangement can remain the same, with a drain (or source) of the FET 110 coupled to the (now top) electrode 80 through one or more conductive patterns. Similarly, the source line SL 160 may be coupled to the SOT induction wiring layer 15 and the selector layer 140 may also be coupled to the SOT induction wiring layer 15 through one or more conductive patterns. Variations on these aspects are discussed with respect to the various Figures, below.

The selector layer 140 operates as a switching device. Using a switching device between a write word line WWL 150 is beneficial because it can reduce or eliminate leakage current from an operating memory cell or from other memory cells passing along the resistive network. Using a selector layer 140 instead of another type of switching device, such as another FET device, provides an increase in device density by reducing the number of FET devices required, since half the FET devices are needed to control the MRAM device as compared to an MRAM device using a FET device as a switching device. Lateral spacing of, for example, the MTJ film stack 100 and the SOT induction wiring layer 15 may reduce some of the space savings from reducing the number of FET devices, however, the reduced number of FET devices decreases power consumption. Additionally, by utilizing SOT-MRAM cells 90 rather than STT-MRAM cells the power requirements are less so that the transistor sizing of the FET 110 can also be reduced. In some embodiments, the area size of the SOT-MRAM device can be about 20% to 50% of the area size of a comparable SRAM device and about the same size as an STT-MRAM device, while requiring less power, providing faster switching, and more robust longevity (an increased number of switching cycles). The present embodiments further reduce the complexity of manufacturing the SOT-MRAM device by using a shared selector layer 140 for a group of SOT-MRAM cells 90.

The selector layer 140 operates when biased by a voltage which causes current to flow through the selector. Thus, the selector layer 140 can be "turned on" when a voltage is biased between the source line SL 160 and the write word line WWL 150. For example, if the selector layer 140 is positive biased from the write word line WWL 150 to the source line SL 160, then the current Je can flow in one direction across the SOT induction wiring layer 15 inducing the free layer 20 to change spin state. If the selector layer 140 is reverse biased from the write word line WWL 150 to the source line SL 160, then the current Je can flow in the opposite direction across the SOT induction wiring layer 15 inducing the free layer 20 to change spin state in a reverse direction. If the selector layer 140 is not biased, however, then current will not flow across the SOT induction wiring layer 15 and a read operation can be performed through the MTJ film stack 100. The reading and writing operation is discussed in greater detail below.

The material of the selector layer 140 may be chosen such that, when biased, electrons will flow across the shortest distance of the selector layer 140 and not into neighboring SOT-MRAM cells 90. In other words, the biasing has a local effect so that even though the selector layer 140 may extend horizontally in the x-y plane to neighboring cells, the biasing will only be effective in the vertical direction (z-direction) to allow electrons to flow in the z-direction across the selector layer 140, for example, from an upper via to a lower via or vice versa.

In some embodiments, the selector layer 140 is made of a material including $HfO_x$, where $0<x\leq2$. The selector layer 140 may be doped with one or more materials, such as Cu, Al, N, P, S, Si, Zr, Gd, Ti, La and Te. The selector layer 140 may be doped to a concentration between about $10^{16}$ cm$^{-3}$ and about $10^{18}$ cm$^{-3}$. In some embodiments, the atomic percent of the dopant may be between about 0.2% to about 20% of the selector layer 140. The selector layer 140 may have a gradient of concentration of the dopant such that the dopant has a greatest concentration at the top or the bottom of the selector layer 140 and decreases deeper (from the greatest concentration) into the material of the selector layer 140. The gradient may be linear or may be logarithmic. In some embodiments, the dopant may be minimal or altogether absent on a side opposite of the side of the selector layer 140 with the greatest concentration of dopant. In some embodiments, the thickness of the selector layer 140 is in a range from about 2 nm to about 20 nm and is in a range from about 5 nm to about 15 nm in other embodiments, though other dimensions are contemplated and may be used. In some embodiments the selector layer 140 may include a top and/or bottom electrode, such as described below with respect to FIGS. 33A through 33F.

A doped HfOx selector layer 140 has been seen to exhibit many desirable properties for a selector material for a shared selector for embodiment SOT-MRAM devices. The on resistance is about 1 kΩ and the on/off resistance ratio is about $10^7$, which means that the off resistance is about $10^{10}$Ω. The leakage current is about $10^{-11}$ Å. This indicates that when biased "on" the selector looks like a 1 kΩ resistor, which causes the current draw across the SOT induction wiring layer 15 to be measured in sub-milliamps when the voltage across the selector layer 140 is less than 1V. When the selector layer 140 is not biased "on" (i.e., "off"), the resistance is quite high and the leakage current is very low. The turn on slope is about 2.8 mV/Dec. The on voltage depends on the thickness of the selector layer 140. At 2 nm thick the on voltage is about 0.3 V, at 3 nm thick the on voltage is about 0.4 V, and at 4 nm thick the on voltage is about 0.7 V. The holding voltage is 0.02 V, and the turn on speed is about 5 ns. The current flow is about 16 MA/cm$^2$ and thermal stability is about 300° C. The above values should be understood to include a range about ±10%-20%.

In other embodiments, the selector layer 140 may be made from other materials and have electrical characteristics based on those materials. In such embodiments, the selector layer 140 may include one or more materials selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In certain embodiments, the selector layer 140 is a chalcogenide or a solid-electrolyte material containing one or more of Ge, Sb, S, and Te. In other embodiments, the selector layer 140 is made of a material including $SiO_x$, $TiO_x$, $AlO_x$, $WO_x$, $Ti_xN_yO_z$, $TaO_x$, $NbO_x$, or the like, or suitable combinations thereof, where x, y and z are non-stoichiometric values. In some embodiments, the selector layer 140 includes an oxygen deficient transition metal oxide. In some embodiments, the material of the selector layer 140 is an electrochemical metallization (ECM) based selector. In other embodiments, the material of the selector layer 140 is an ovonic threshold switching (OTS) material, which is an amorphous material.

FIGS. 3, 6, 9, 12, 15, and 18 are schematic cross-sectional views of a portion of a SOT-MRAM device, in accordance with various embodiments. Some aspects of the illustrated layers of the SOT-MRAM device may be flattened into these cross-sectional views and it should be understood that some of the layers may exist in actuality in other cross-sections. FIGS. 4, 7, 10, 13, 15, and 19 are respective three-dimensional views of the SOT-MRAM devices illustrated in FIGS. 3, 6, 9, 12, 15, and 18. FIGS. 5, 8, 11, 14, and 16 are respective circuit diagrams consistent with those embodiments illustrated in FIGS. 3, 6, 9, 12, and 15. The circuit diagram of FIG. 16 may also be applied to the embodiments illustrated in FIG. 18.

Materials, configurations, dimensions, processes, and/or operations described with respect to FIGS. 1 and 2 may be employed in the following embodiments, and detailed explanation thereof may be omitted. Referring in general to FIGS. 3, 6, 9, 12, 15, and 18, in some embodiments, the SOT-MRAM device includes a layered structure having a multiple wiring layer structure. In some embodiments, the multiple wiring layer structure includes "Mx" (x=0, 1, 2, 3, . . . ) metal wiring layers, which are located at respective levels disposed over a substrate, and "Vy" (y=0, 1, 2, 3, . . . ) vias (contacts) connecting the My metal wiring layer to the My+1 metal wiring layer. The metal wiring layers include metal lines which are embedded in a dielectric material layer. The vias include conductive plugs embedded in an interlayer dielectric (ILD) material which separates adjacent metal wiring layers. For the purpose of illustration and labelling, the elements ending in "A" correspond to the x=0, y=0 levels, the elements ending in "B" correspond to the x=1, y=1 levels, the elements ending in "C" correspond to the x=3, y=3 levels, and so forth. In some embodiments, the even-number metal wiring layers extend in one direction (e.g., X) and the odd-numbered metal wiring layers extend in another direction (e.g., Y) crossing the one direction. In some embodiments, pitches for metal wirings may generally increase as the levels increase. For example, the metal wiring pitches in levels M3 and M4 may be the same and pitches for the metal wirings in M5 or higher may be the same and may be larger than the pitches for the metal wirings in M3 and M4.

In some embodiments, the metal wirings and vias are made of one or more of aluminum, cobalt, copper, a copper alloy, tungsten, titanium, titanium nitride, tantalum, tantalum nitride, alloys thereof, the like, or combinations thereof. The vias may also include barrier or adhesion material layers surrounding the sides of the vias and formed of one or more layers of titanium, titanium nitride, tantalum, tantalum nitride, tungsten nitride, ruthenium, rhodium, platinum, other noble metals, other refractory metals, their nitrides, combinations of these, or the like.

In some embodiments, the ILD layers are formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof.

The contact plugs 118 connect a source region 112S or drain region 112D of the FET 110 to the M0 metal wiring layer (e.g., conductive line 130A) through a dielectric layer 104. The bit line 125 is in the M0 metal wiring layer and coupled to the source region 112S of the FET 110. The drain region 112D of the FET 110 is coupled to the electrode 80 of the MTJ film stack 100. The write word line WWL 150 is coupled to the selector layer 140, which is coupled to one end of the SOT induction wiring layer 15. The source line SL 160 is coupled to the other end of the SOT induction wiring layer 15 such that a current passes may pass through the SOT induction wiring layer 15 and induce spin change effects in the MTJ film stack 100 which is magnetically coupled to the SOT induction wiring layer 15.

The selector layer 140 is disposed in one of the metal wiring layers. Due to the manufacturing processes, it is desirable to dispose the selector layer 140 in a metal wiring layer which is disposed above the MTJ film stack 100, though embodiments contemplate also that the selector layer 140 may be disposed in a metal wiring layer which is below the MTJ film stack 100, such as illustrated with respect to FIG. 18. The selector layer 140 continuously extends to each SOT-MRAM cell 90 in a row and/or column of the SOT-MRAM device.

Figure 15:
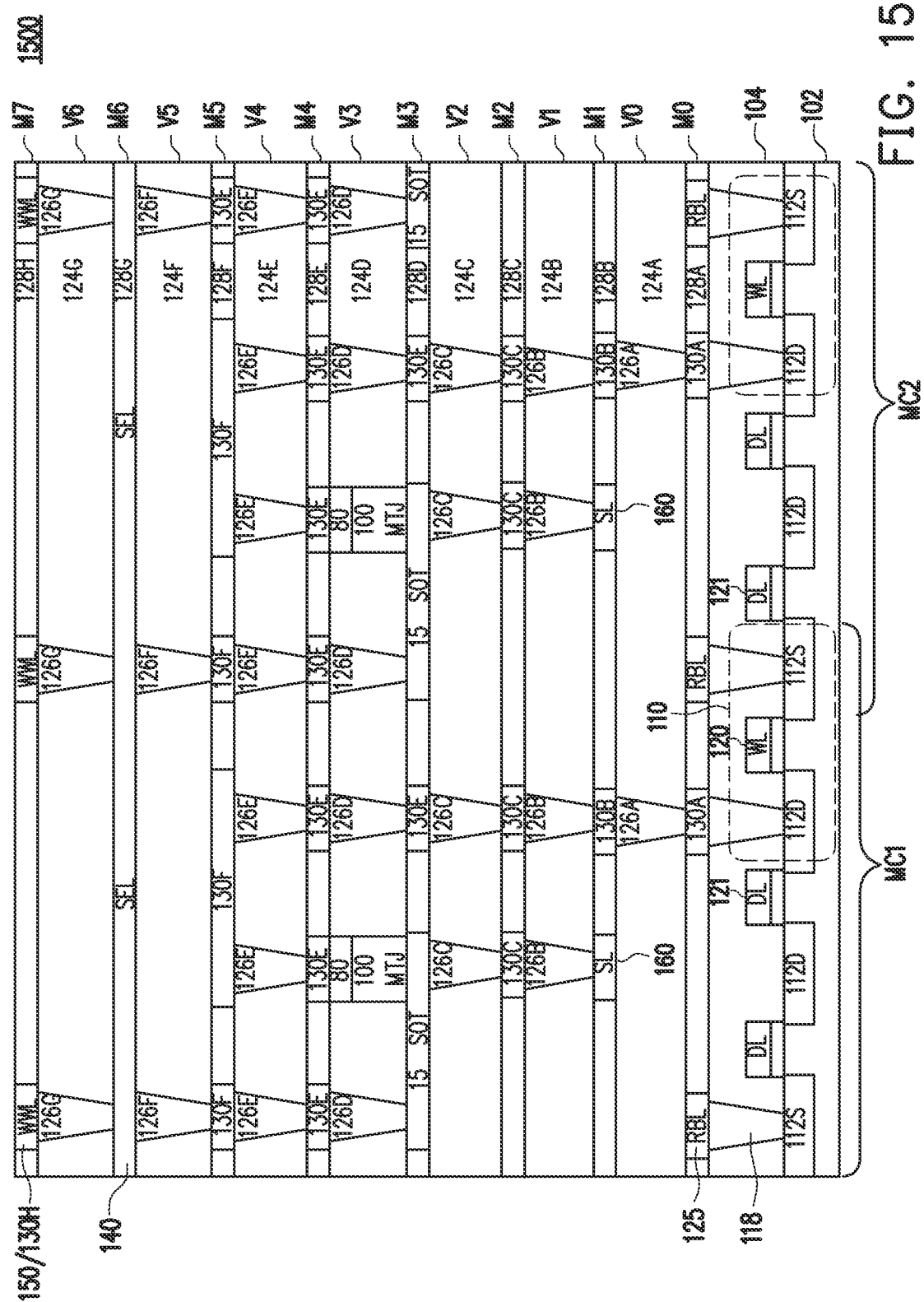
FIGS. 15 through 16 are schematic views of an SOT-MRAM device according to some embodiments.
Figure 18:
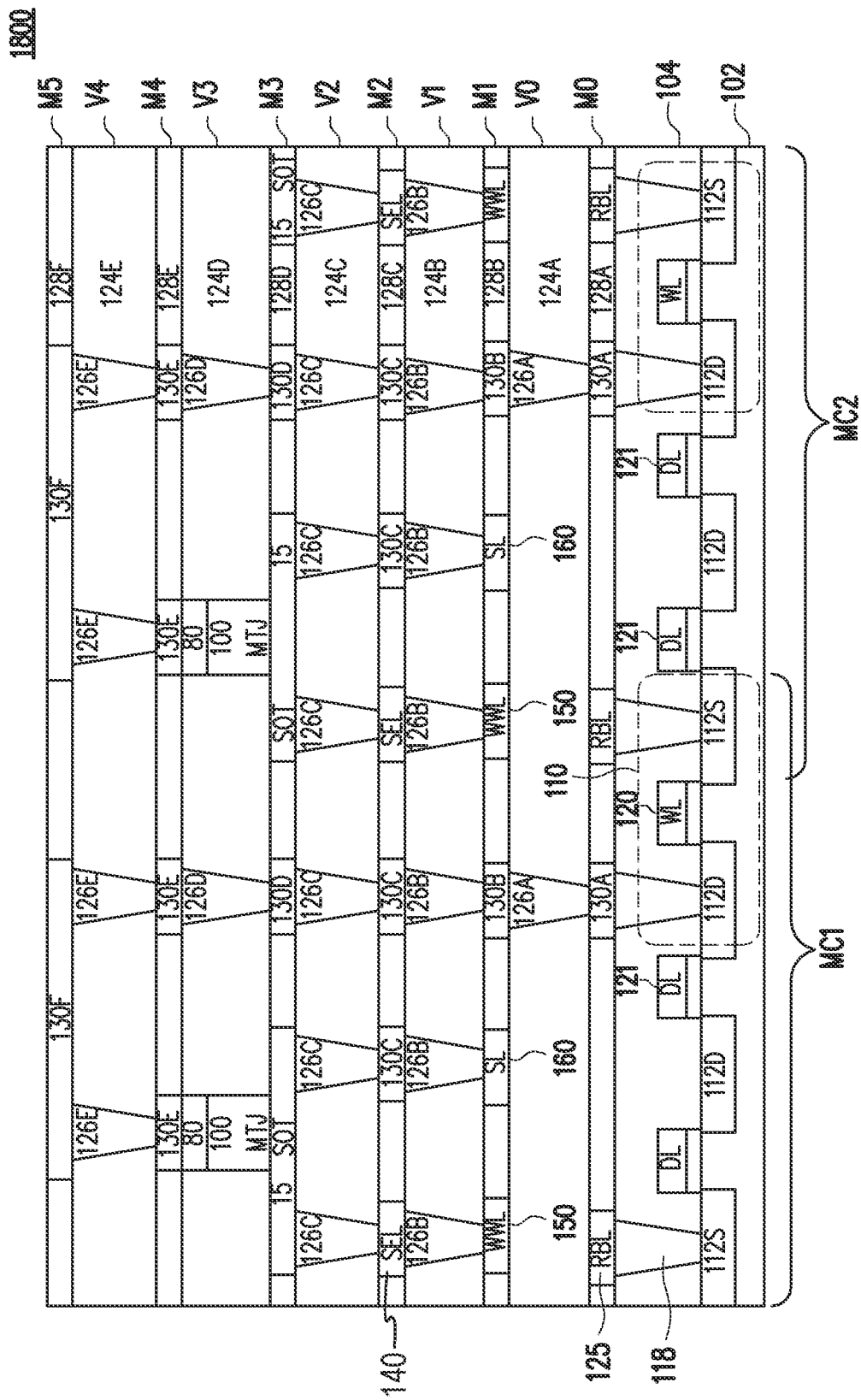
FIGS. 18 through 19 are schematic views of an SOT-MRAM device according to some embodiments.

As noted above, the MTJ film stack 100 may be formed such that the SOT induction wiring layer 15 is disposed above the MTJ film stack 100 and the MTJ film stack 100 is a bottom-pinned MTJ stack. In some embodiments, however, such as illustrated in FIGS. 15 and 18, the MTJ film stack 100 is a top-pinned MTJ stack and the SOT induction wiring layer 15 is disposed in a metal wiring layer below the MTJ film stack 100.

In some embodiments, the FET 110 is a planar FET, a fin FET, or a gate-all-around FET. The electrode 80 is coupled to a drain region 112D of a FET 110 and a source region 112S of the FET 110 is coupled to the bit line 125. In some embodiments, the source region 112S is shared by two adjacent FETs 110. In some embodiments, a pair of FETs 110 sharing the source region 112S is separated by a dummy gate 121 from another pair of FETs 110 sharing a source region 112S. The word lines WL 120 are coupled to the gates of the FET 110 and switch whether a current may flow from the bit line 125 through the MTJ film stack 100 to the source line SL 160.

Differences may be observed among the various arrangements of the SOT-MRAM devices in FIGS. 3, 6, 9, 12, 15, and 18, which are addressed in the specific discussion of each of the various arrangements, below. It can be noted, however, that when a particular element is described as being in a particular metal wiring layer, the disclosure contemplates that any desired number of metal wiring layers may be intervening between the described metal wiring layers. For example, where one element is described as being in the M2 metal wiring layer and another element is described as being in the M3 metal wiring layer, there may be any number of metal wiring layers between the M2 metal wiring layer and the M3 metal wiring layer.

Figure 3:
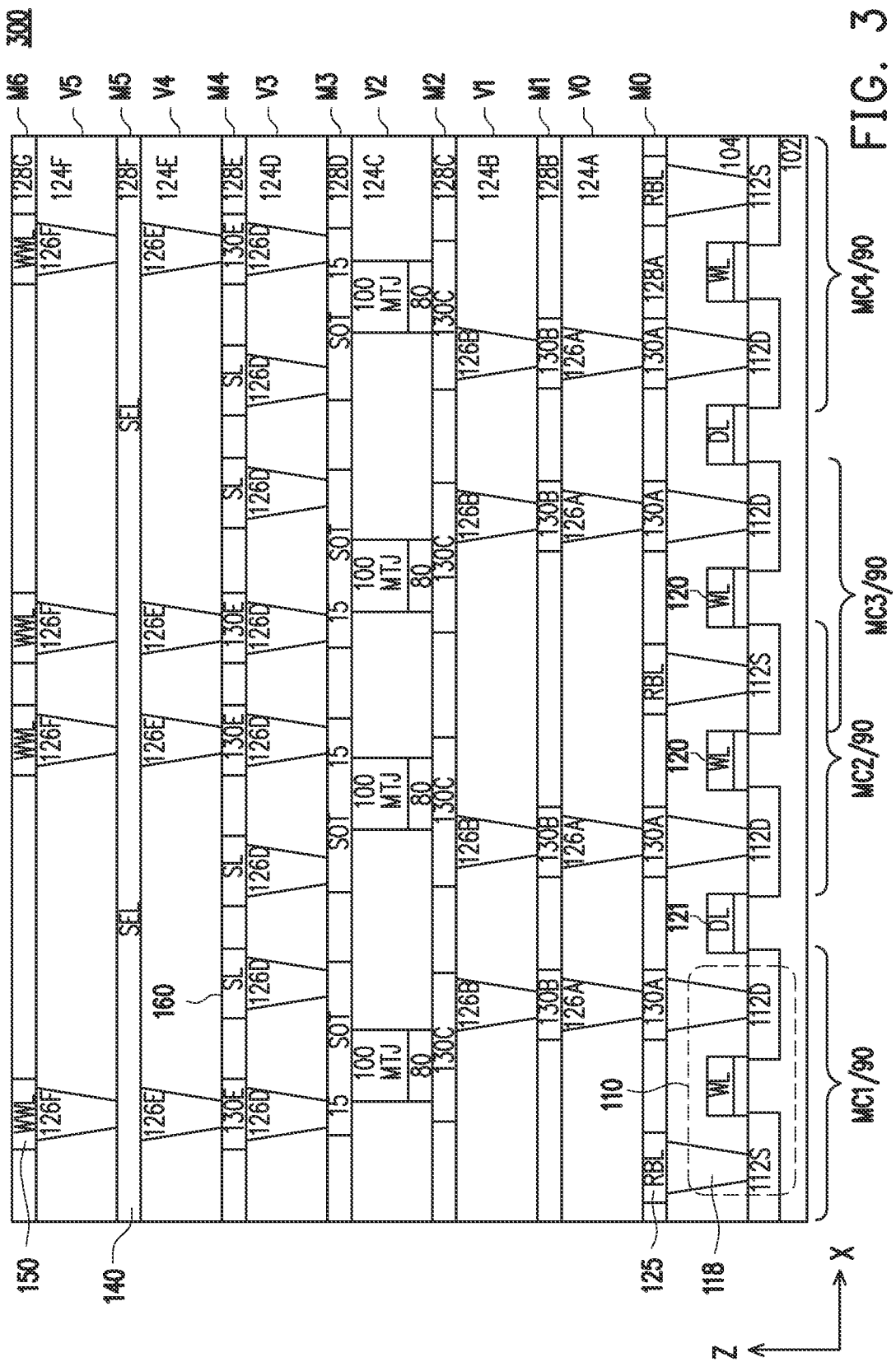
FIGS. 3 through 4 are schematic views of an SOT-MRAM device according to some embodiments.

Referring to FIG. 3, four SOT-MRAM cells 90 of the SOT-MRAM device 300 are illustrated, including MC1, MC2, MC3, and MC4. As illustrated in FIG. 3, two of the memory cells may share a common source region 112S to two adjacent FETs 110. In some embodiments, the source regions 112S may be separated by a dummy gate, similar to the separation of the drain regions 112D by the dummy gate 121.

The bottom electrode 80 may be disposed on the M2 metal wiring layer and the MTJ film stack 100 may be disposed bottom electrode 80. The SOT induction wiring layer 15 may be disposed over the MTJ film stack 100 in the M3 metal wiring layer and the source line SL 160 may be disposed in the M4 metal wiring layer. The selector layer 140 may be disposed in the M5 metal wiring layer and the write word line WWL 150 may be disposed in the M6 metal wiring layer. As illustrated in FIG. 3, the write word line WWL 150 lines and source line SL 160 lines are each directed in the Y direction and have a small cross-section along the X direction.

In some embodiments, the MTJ film stack 100, SOT induction wiring layer 15, source line SL 160, selector layer 140, and write word line WWL 150 may each move down a metal wiring layer or up one or more metal wiring layers.

Figure 4:
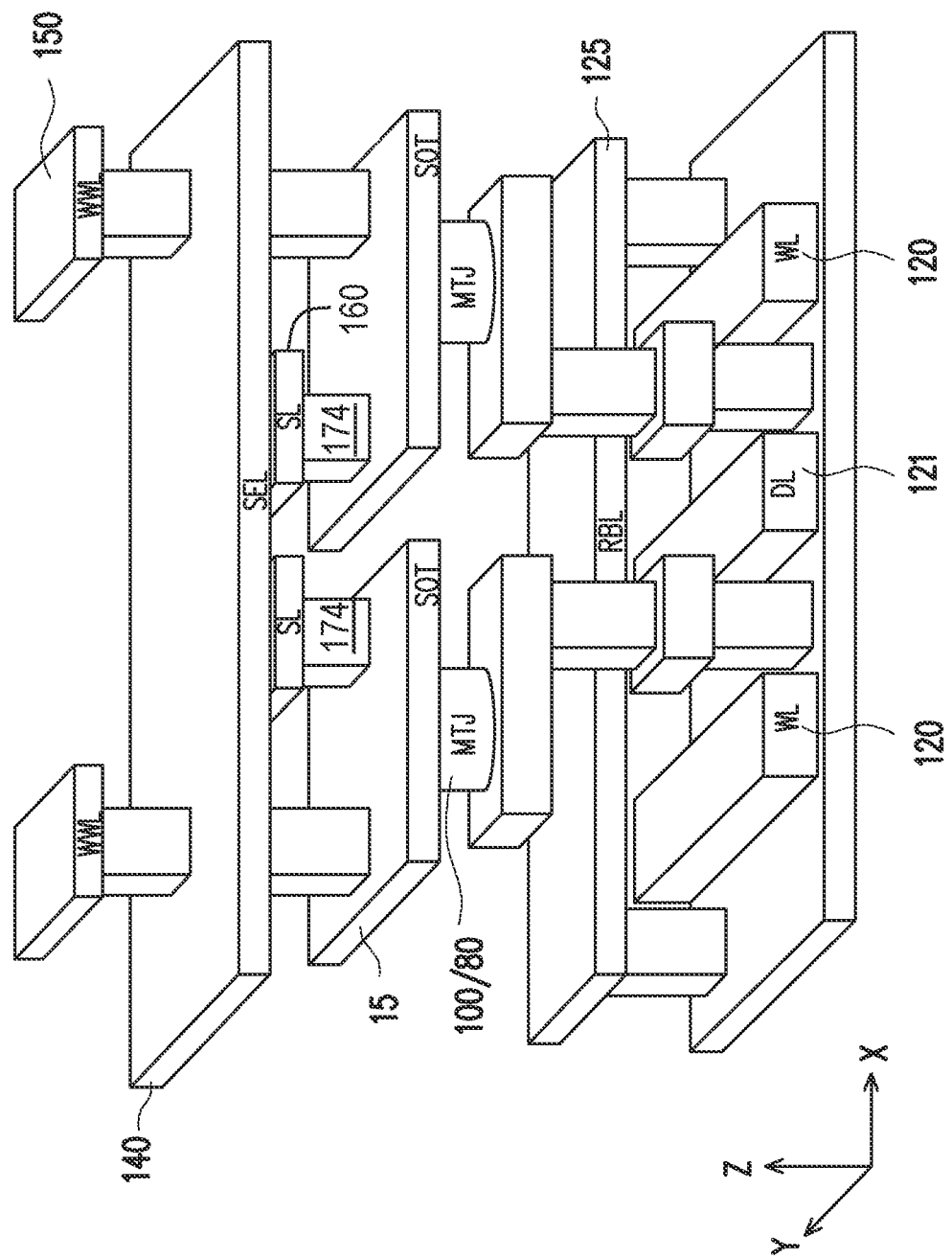

FIG. 4 illustrates a three-dimensional view of two of SOT-MRAM cells MC1 and MC2 of the SOT-MRAM device 300, in accordance with some embodiments. Materials, configurations, dimensions, processes, and/or operations described with respect to FIGS. 1 through 3 may be employed in the following embodiments, and detailed explanation thereof may be omitted. References to particular elements which are not specifically labelled in FIG. 4 can be found in FIG. 3.

In some embodiments, a word line 120 (coupled to a gate of FET 110) extends in the Y direction and a bit line 125 extends in the X direction. The bit line 125 is located above the first word line 120 and coupled to the source region 112S of the FET 110 by a contact plug 118 made of a conductive material. The bottom electrode 80 is coupled to the drain region 112D of the FET by another contact plug 118, a conductive line 130A (or pad), and one or more additional vias 126A/126B in some embodiments. In some embodiments, the conductive line 130A is located at the same level as and made of the same material as the bit line 125.

As shown in FIG. 4, the MTJ film stack 100 is disposed over the bottom electrode 80 and the SOT induction wiring layer 15 is disposed over the MTJ film stack 100. The one end of the SOT induction wiring layer 15 is coupled to the bottom of the selector layer 140 by a via 126D/126E and the other end of the SOT induction wiring layer 15 is coupled to the source line 160 by a via 126D, in some embodiments. In some embodiments, the selector layer 140 is disposed over a bottom electrode (not shown) formed on the via 174. In such a case, the bottom electrode is made of the same material as the source line 160 in some embodiments. In some embodiments, the source line 160 extends in the Y direction.

Further, as shown in FIG. 4, the write word line 150 is disposed over the selector layer 140. In some embodiments, the write word line 150 extends in the Y direction. The write word line 150 is coupled to the top of the selector layer 140 by a via 126F. In some embodiments, a top electrode (not shown) is formed on the top of the selector layer 140 or at the bottom of the via 126F, which is connected to the top electrode. In this embodiment, the SOT induction wiring layer 15 extends in the X direction and the vias 126D are arranged such that the SOT current flows along the X direction or across the SOT induction wiring layer 15.

Figure 5:
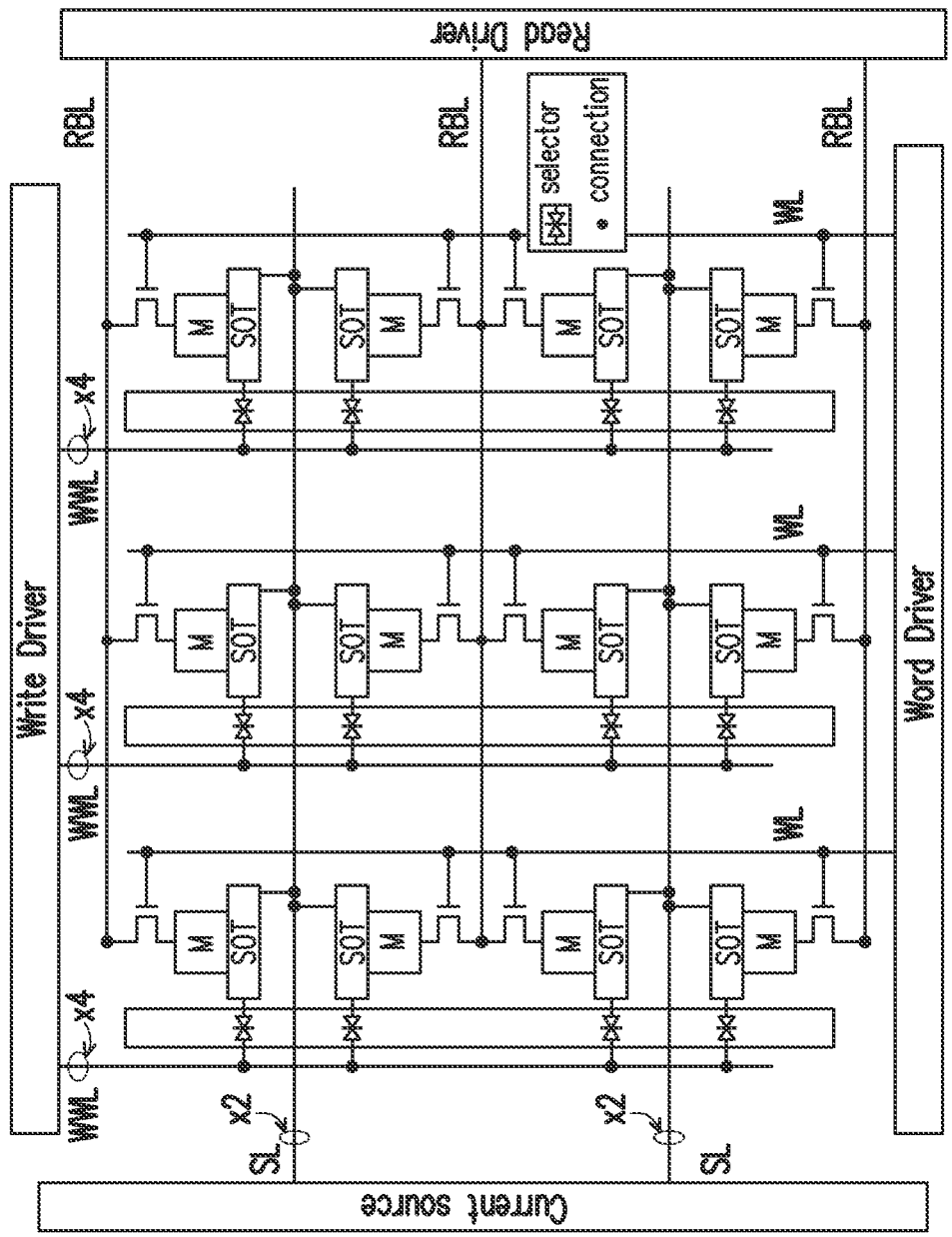
FIG. 5 is a circuit diagram of an SOT-MRAM device according to some embodiments.

FIG. 5 is a circuit diagram of an SOT-MRAM device consistent with the SOT-MRAM device 300, in accordance with some embodiments. Materials, configurations, dimensions, processes, and/or operations described with respect to FIGS. 1-4 may be utilized in the following embodiments, and detailed explanation thereof may be omitted.

In some embodiments, bit lines, for example read bit lines RBL, and source lines SL, both extend in a row direction, and first word line WL and second word line (write word line) WWL extend in a column direction. SOT-MRAM cells are disposed at locations defined by a read bit line RBL, a write word line WWL, a word line WL and a source line SL in some embodiments. The number of memory cells coupled to the same word lines and/or the same bit lines is not limited to three or four and can be more than 3, e.g., 4, 8, 16, 32, 64, 128, 256, 512 or 1024 or more. The word lines WL are coupled to a word driver circuit (row decoder), the source lines SL are coupled to a current source circuit, the read bit lines RBL are coupled to a read driver circuit (read circuit or column decoder) and the write word lines WWL are coupled to a write driver circuit (write circuit or row decoder). One end of the SOT induction wiring layer 15 (SOT) is coupled to a corresponding source line SL, and the other end of SOT induction wiring SOT is coupled to a corresponding write word line WWL through a selector. One end of the MTJ film stack MTJ is coupled to a corresponding read bit line through an FET, of which the gate is coupled to a corresponding word line.

In the embodiment of FIG. 5, vertically adjacent SOT-MRAM cells along the column direction are coupled in pairs to the same read bit line RBL. Horizontally adjacent SOT-MRAM cells along the row direction are coupled to the same read bit line RBL. The SOT-MRAM cells are coupled to word lines WL, where each column of cells are coupled to a same word line WL. The write word lines WWL are indicated by "x4" to convey four separate lines to separately connect from a write driver to the SOT layer through a selector. The connection points along the WWL lines are offset to indicate that they are each connected to different ones of the WWL lines. The selectors are coupled together. The source lines SL are indicated by "x2" to convey two separate lines to separately connect from a current source to the SOT layer for each row. Horizontally adjacent SOT-MRAM cells along the row direction may share the same source line SL.

Figure 6:
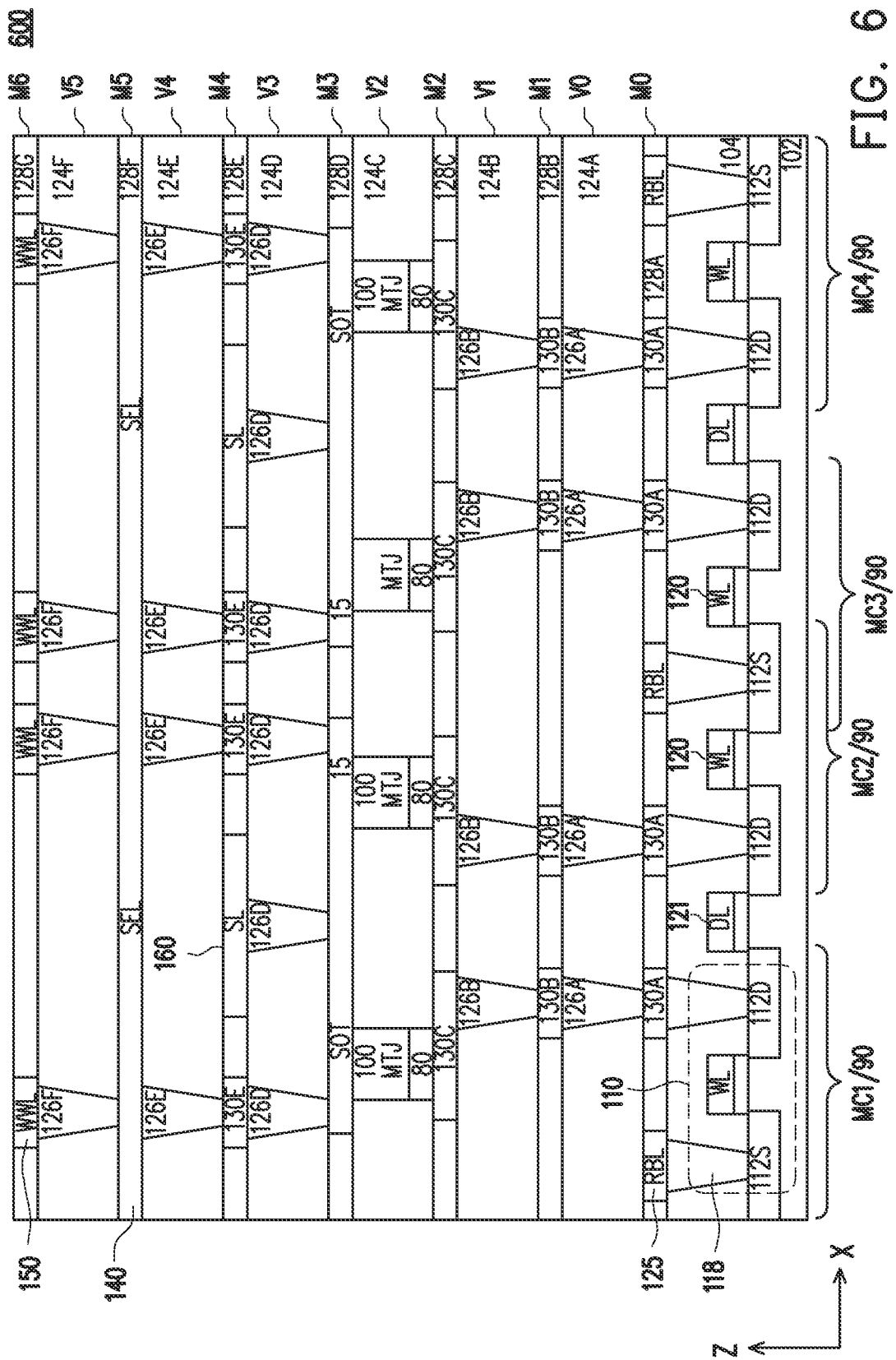
FIGS. 6 through 7 are schematic views of SOT-MRAM cells according to some embodiments.

Referring to FIG. 6, four SOT-MRAM cells 90 of the SOT-MRAM device 600 are illustrated, including MC1, MC2, MC3, and MC4. Materials, configurations, dimensions, processes, and/or operations described with respect to FIGS. 1 through 5 may be utilized in the following embodiments, and detailed explanation thereof may be omitted. In particular, the SOT-MRAM device 600 is similar to the SOT-MRAM device 300 of FIG. 3. In the SOT-MRAM device 600, however, the source line 160 of adjacent SOT-MRAM cells (e.g., MC1 and MC2) are joined together to share the same source line 160. The manufacture of the SOT-MRAM device 600 may be simplified as a result.

Figure 7:
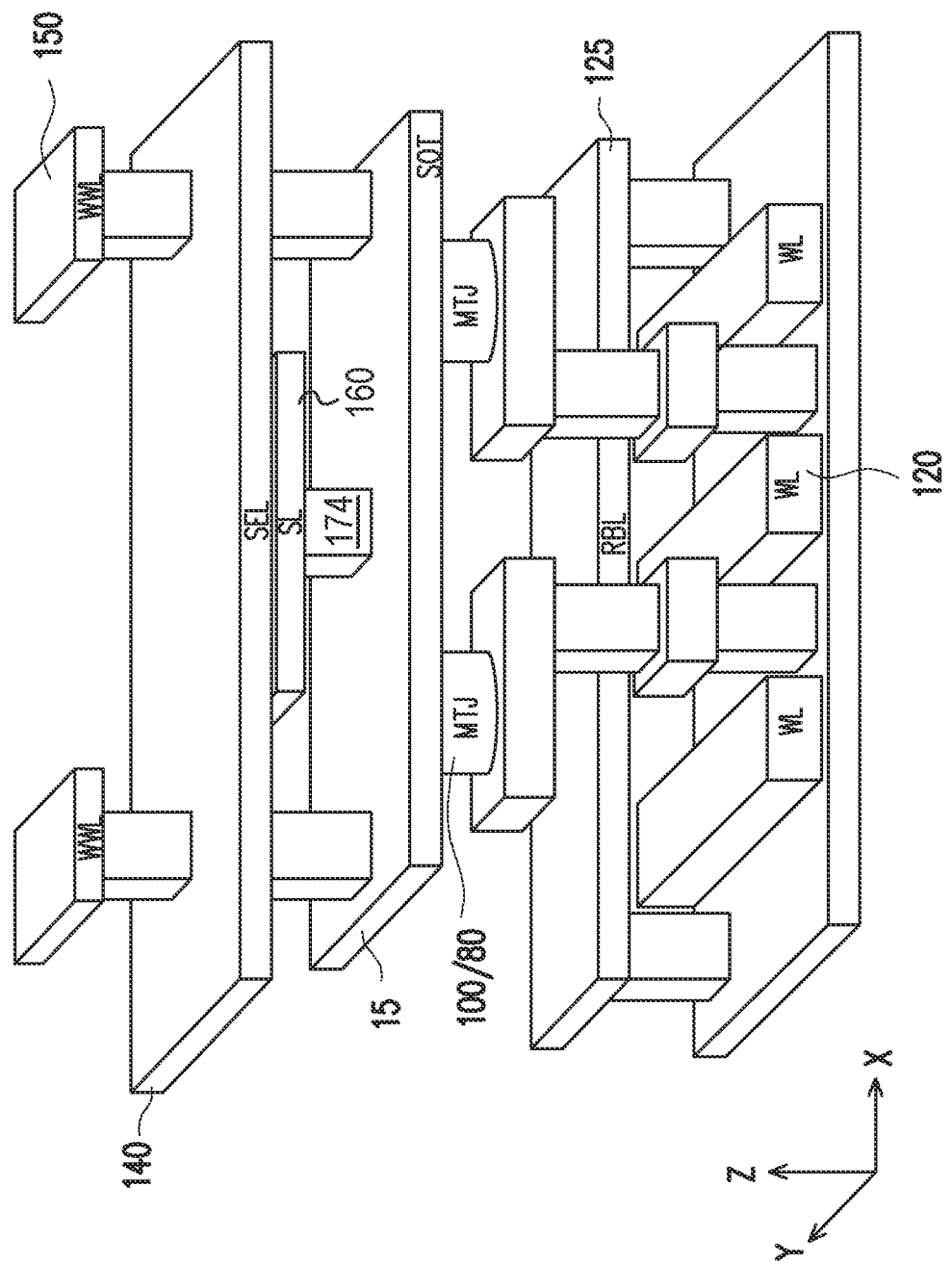

FIG. 7 illustrates a three-dimensional view of two of SOT-MRAM cells MC1 and MC2 of the SOT-MRAM device 600, in accordance with some embodiments. Materials, configurations, dimensions, processes, and/or operations described with respect to FIGS. 1 through 5 may be employed in the following embodiments, and detailed explanation thereof may be omitted. References to particular elements which are not specifically labelled in FIG. 7 can be found in FIG. 6.

The three-dimensional view of the SOT-MRAM device 600 is similar to that described above with respect to FIG. 4. It is noted, however, that the source line SL 160 may be shared between two adjacent SOT-MRAM cells 90.

Figure 8:
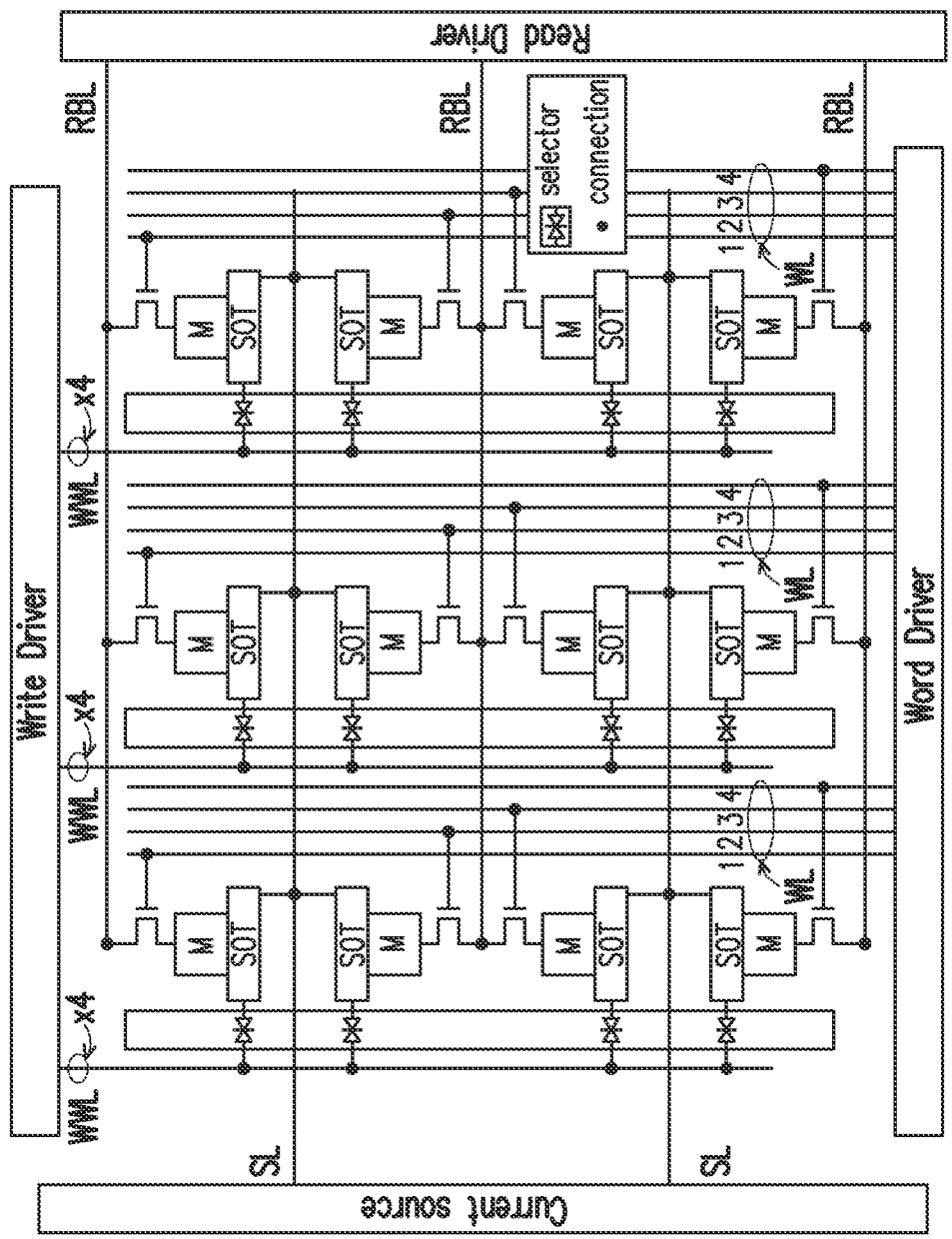
FIG. 8 is a circuit diagram of an SOT-MRAM device according to some embodiments.

FIG. 8 is a circuit diagram of an SOT-MRAM device consistent with the SOT-MRAM device 600, in accordance with some embodiments. Materials, configurations, dimensions, processes, and/or operations described with respect to FIGS. 1-5 may be utilized in the following embodiments, and detailed explanation thereof may be omitted.

The circuit diagram is similar to that discussed with respect to FIG. 5, except that the source lines extend from the current source such that it is not just shared among horizontally adjacent SOT-MRAM cells 90 along the row direction, but also shared by pairs of vertically adjacent SOT-MRAM cells 90 along the column direction. Eliminating one of the source lines 160 reduces the total complexity of the device as well as provides margin for additional reduction of the size of the SOT-MRAM cells 90.

Figure 9:
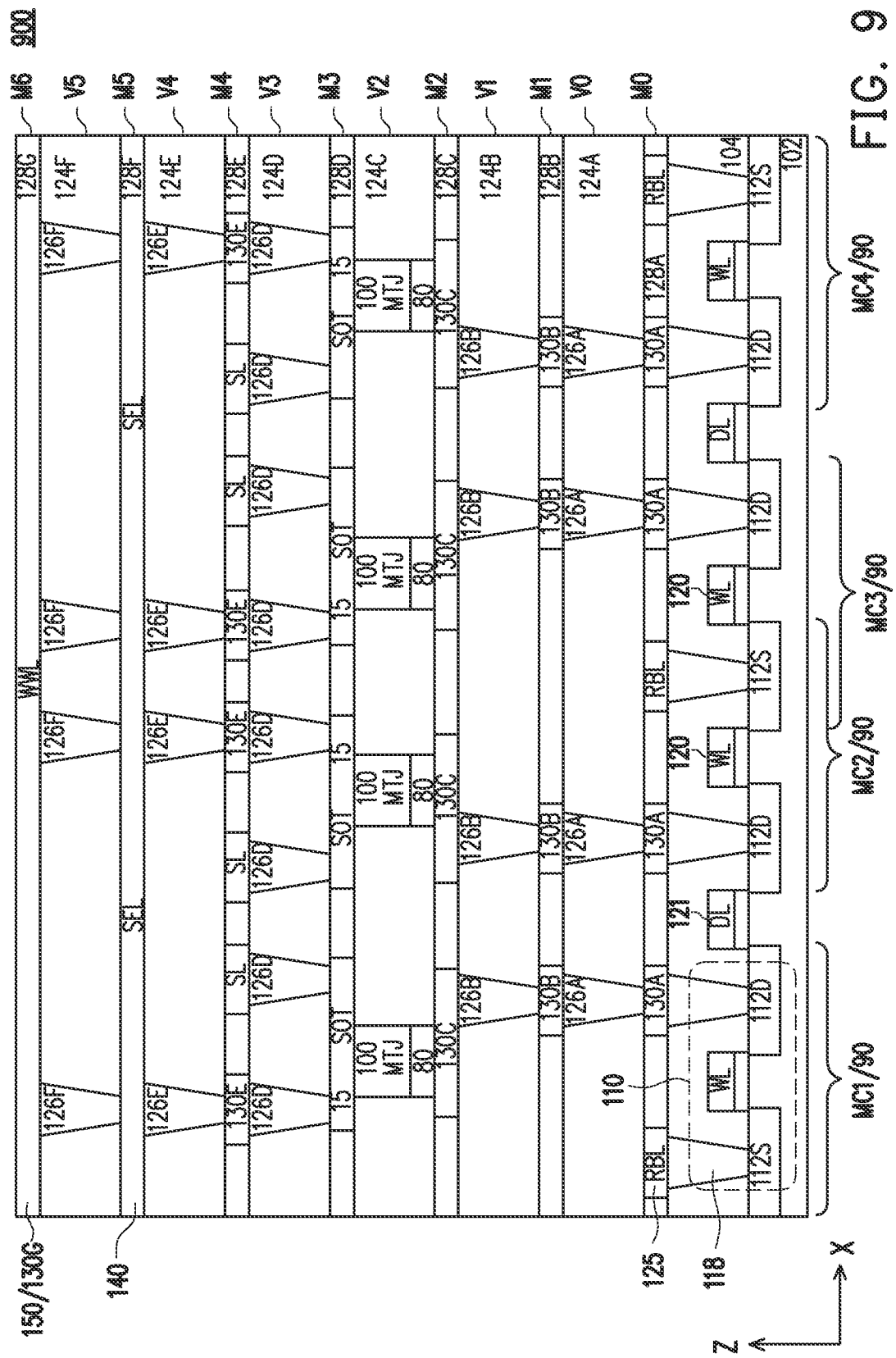
FIGS. 9 through 10 are schematic views of SOT-MRAM cells according to some embodiments.

Referring to FIG. 9, four SOT-MRAM cells 90 of the SOT-MRAM device 900 are illustrated, including MC1, MC2, MC3, and MC4. Materials, configurations, dimensions, processes, and/or operations described with respect to FIGS. 1 through 5 may be utilized in the following embodiments, and detailed explanation thereof may be omitted. In particular, the SOT-MRAM device 900 is similar to the SOT-MRAM device 300 of FIG. 3. In the SOT-MRAM device 900, however, the write word line 150 of adjacent SOT-MRAM cells (e.g., MC1 and MC2) are joined together to share the same write word line 150. The manufacture of the SOT-MRAM device 900 may be simplified as a result.

Figure 10:
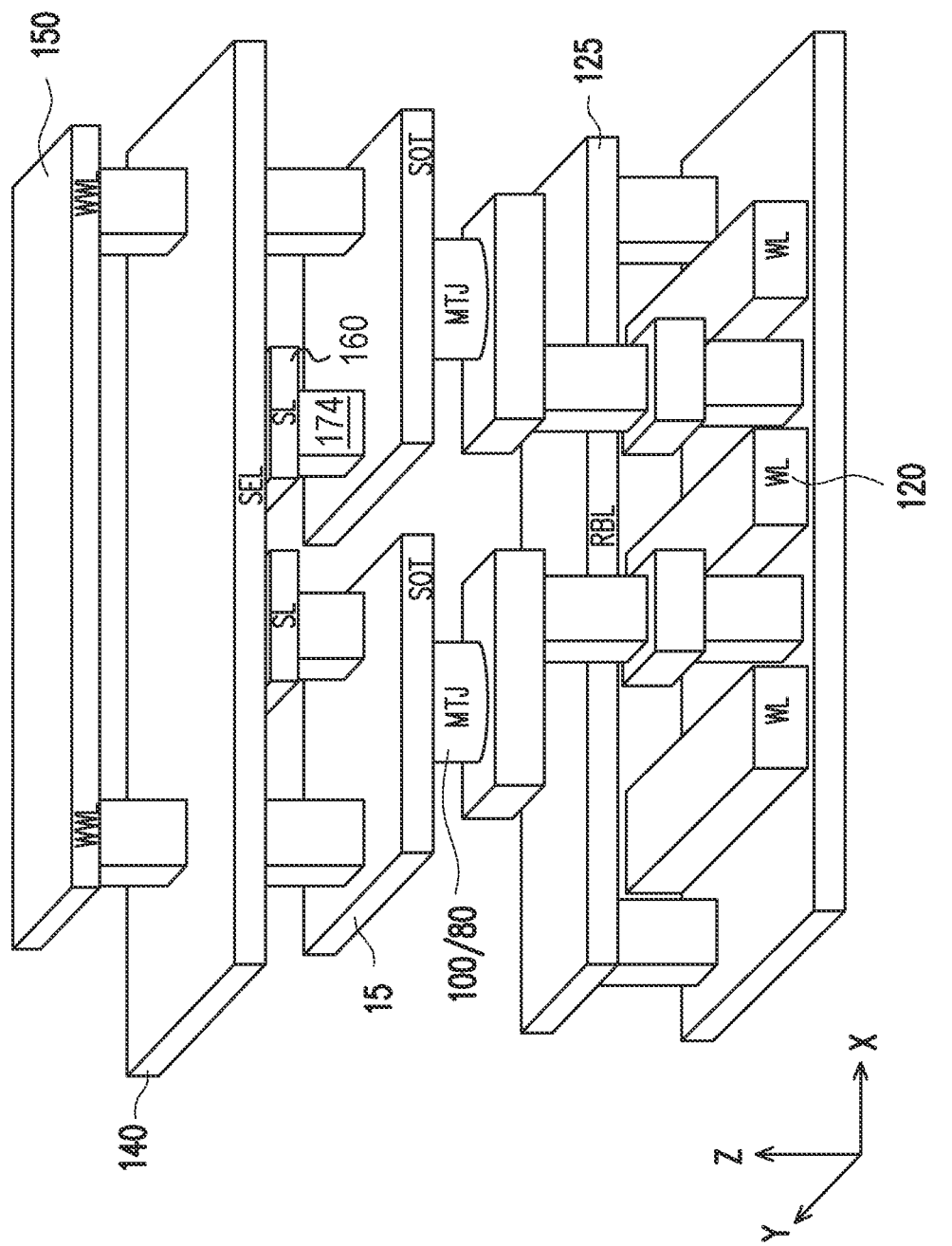

FIG. 10 illustrates a three-dimensional view of two of SOT-MRAM cells MC1 and MC2 of the SOT-MRAM device 900, in accordance with some embodiments. Materials, configurations, dimensions, processes, and/or operations described with respect to FIGS. 1 through 5 may be employed in the following embodiments, and detailed explanation thereof may be omitted. References to particular elements which are not specifically labelled in FIG. 10 can be found in FIG. 9.

The three-dimensional view of the SOT-MRAM device 900 is similar to that described above with respect to FIG. 4. It is noted, however, that the write word line 150 may be shared between two adjacent SOT-MRAM cells 90.

Figure 11:
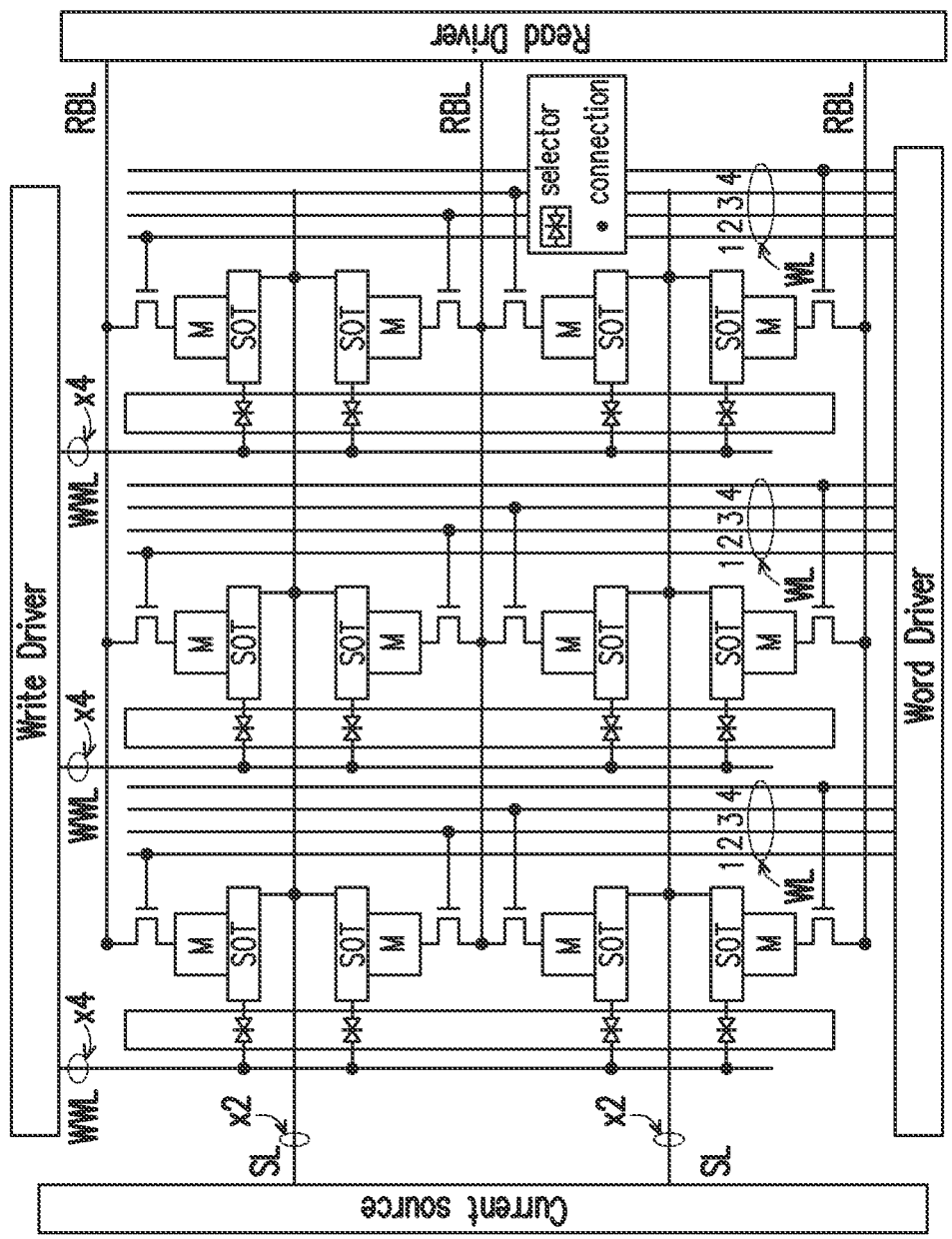
FIG. 11 is a circuit diagram of an SOT-MRAM device according to some embodiments.

FIG. 11 is a circuit diagram of a SOT-MRAM device consistent with the SOT-MRAM device 900, in accordance with some embodiments. Materials, configurations, dimensions, processes, and/or operations described with respect to FIGS. 1-5 may be utilized in the following embodiments, and detailed explanation thereof may be omitted.

The circuit diagram of FIG. 11 is similar to that discussed with respect to FIG. 5, except that the write word lines WWL 150 extend from the write driver such that they are shared among vertically adjacent SOT-MRAM cells 90 along the column direction. Eliminating multiple write word lines WWL 150 reduces the total complexity of the device as well as provides margin for additional reduction of the size of the SOT-MRAM cells 90.

Figure 12:
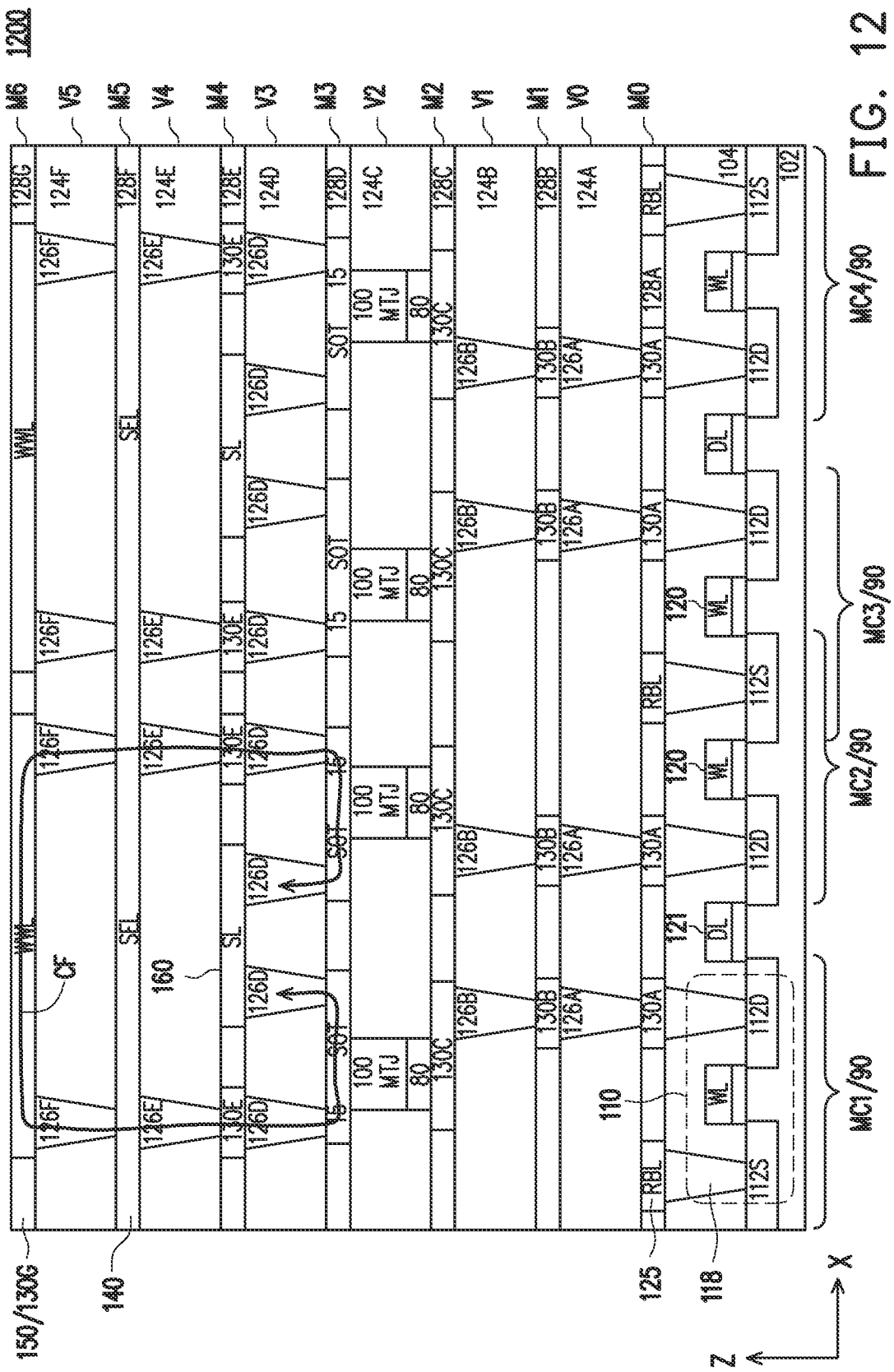
FIGS. 12 through 13 are schematic views of an SOT-MRAM device according to some embodiments.

Referring to FIG. 12, four SOT-MRAM cells 90 of the SOT-MRAM device 1200 are illustrated, including MC1, MC2, MC3, and MC4. Materials, configurations, dimensions, processes, and/or operations described with respect to FIGS. 1 through 5 may be utilized in the following embodiments, and detailed explanation thereof may be omitted. In particular, the SOT-MRAM device 1200 is similar to the SOT-MRAM device 300 of FIG. 3. In the SOT-MRAM device 1200, however, the write word line 150 of adjacent SOT-MRAM cells (e.g., MC1 and MC2) are joined together to share the same write word line 150. Also, in the SOT-MRAM device 1200, the source line 160 of adjacent SOT-MRAM cells (e.g., MC1 and MC2) are joined together to share the same source line 160. The manufacture of the SOT-MRAM device 1200 may be simplified as a result. In such embodiments, adjacent MTJs 100, e.g., from MC1 and MC2, may be written with opposite orientation, resulting in a complementary operation. For example, a common current flow (CF) from the write word line WWL is illustrated in FIG. 12 as flowing through the selector across the SOT 15 to the source line SL.

Figure 13:
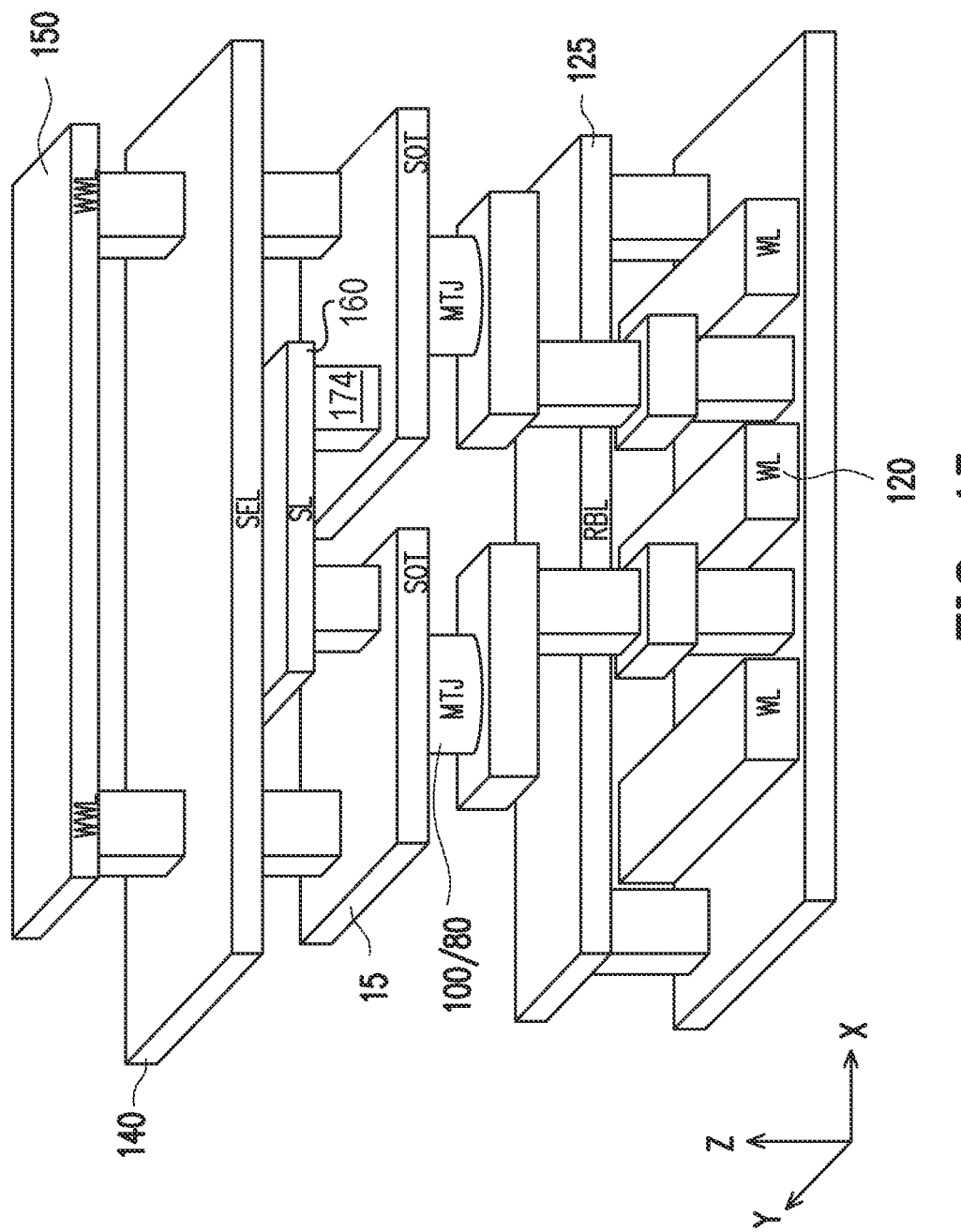

FIG. 13 illustrates a three-dimensional view of two of SOT-MRAM cells MC1 and MC2 of the SOT-MRAM device 1200, in accordance with some embodiments. Materials, configurations, dimensions, processes, and/or operations described with respect to FIGS. 1 through 5 may be employed in the following embodiments, and detailed explanation thereof may be omitted. References to particular elements which are not specifically labelled in FIG. 13 can be found in FIG. 12.

The three-dimensional view of the SOT-MRAM device 1200 is similar to that described above with respect to FIG. 4. It is noted, however, that the write word line 150 may be shared between two adjacent SOT-MRAM cells 90. Also, the source line SL 160 may be shared between two adjacent SOT-MRAM cells 90.

Figure 14:
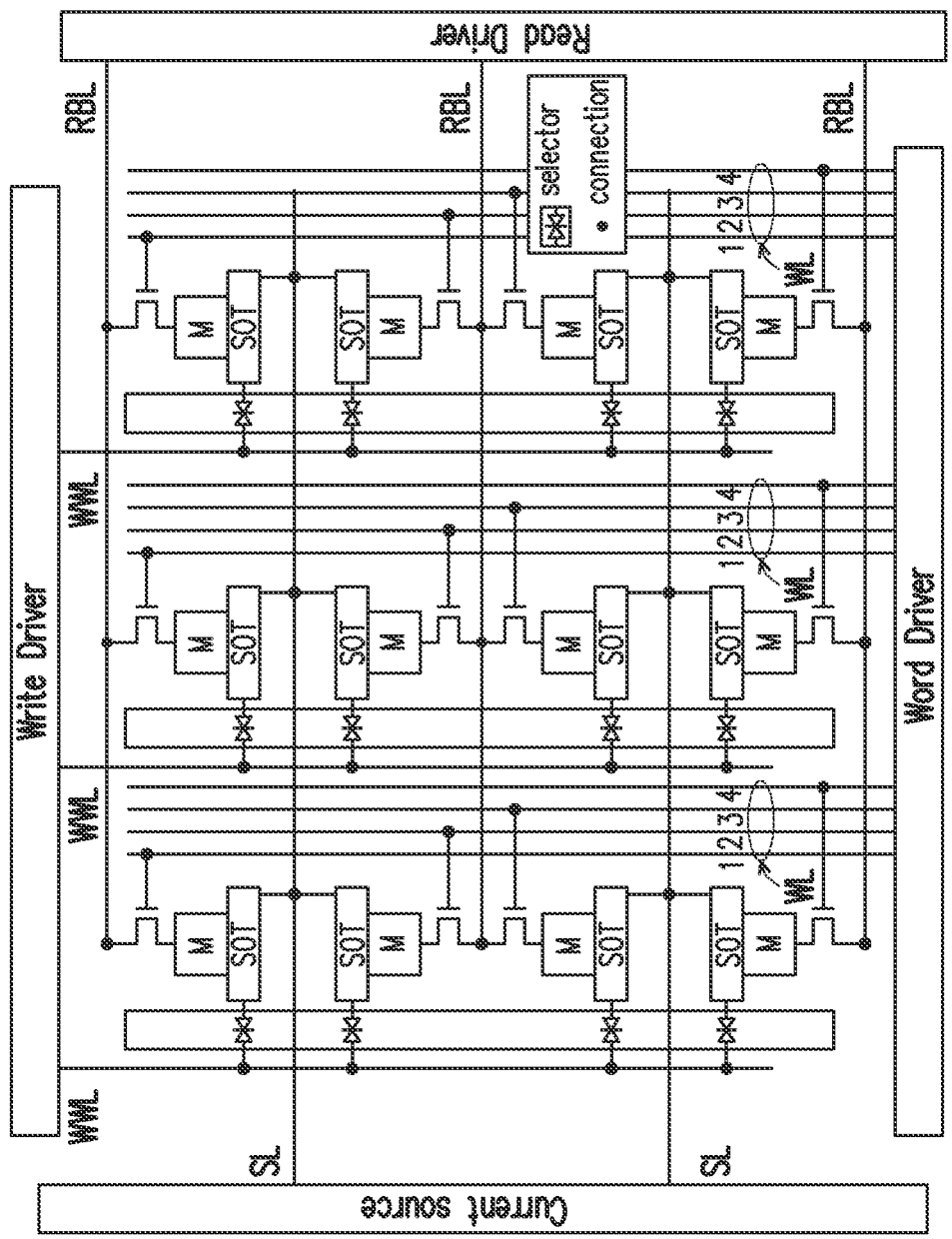
FIG. 14 is a circuit diagram of an SOT-MRAM device according to some embodiments.

FIG. 14 is a circuit diagram of a SOT-MRAM device consistent with the SOT-MRAM device 1200, in accordance with some embodiments. Materials, configurations, dimensions, processes, and/or operations described with respect to FIGS. 1-5 may be utilized in the following embodiments, and detailed explanation thereof may be omitted.

The circuit diagram of FIG. 14 is similar to that discussed with respect to FIG. 5, except that the write word lines WWL 150 extend from the write driver such that they are shared among vertically adjacent SOT-MRAM cells 90 along the column direction. Also, the source lines 160 extend from the current source such that it is not just shared among horizontally adjacent SOT-MRAM cells 90 along the row direction, but also shared by pairs of vertically adjacent SOT-MRAM cells 90 along the column direction. Eliminating source lines 160 and write word lines 150 reduces the total complexity of the device as well as provides margin for additional reduction of the size of the SOT-MRAM cells 90.

Referring to FIG. 15, two SOT-MRAM cells 90 of the SOT-MRAM device 1500 are illustrated, including MC1 and MC2. Materials, configurations, dimensions, processes, and/or operations described with respect to FIGS. 1 through 5 may be utilized in the following embodiments, and detailed explanation thereof may be omitted. In particular, the SOT-MRAM device 1500 is similar to the SOT-MRAM device 300 of FIG. 3. In the SOT-MRAM device 1500, however, the MTJ film stack 100 and bottom electrode 80 are inverted and formed on top of the SOT induction wiring layer 15. In order to couple the drain region 112D of the FET 110 to the electrode 80, the wiring pattern extends further up into the higher metal wiring layers. The source line 160 may be disposed in lower metal wiring layers. Although the design and layout of the SOT-MRAM device 1500 uses more dummy gates 121, the tradeoff is that a top-pinned MTJ film stack 100 is easier to manufacture over the top of the SOT induction wiring layer 15. Utilizing shared selector layer 140 still provides advantages. In some embodiments the write word line 150 of adjacent SOT-MRAM cells (e.g., MC1 and MC2) may be joined together to share the same write word line 150. In some embodiments, the source line 160 of adjacent SOT-MRAM cells (e.g., MC1 and MC2) may be joined together to share the same source line 160. The manufacture of the SOT-MRAM device 1500 may be simplified as a result of these aspects as well as the shared selector layer 140.

In one embodiment the bit line 125 is in the metal wiring layer M0, the source line 160 is in the metal wiring layer M1.

The source line 160 is coupled to the SOT induction wiring layer 15 in the metal wiring layer M3. The write word line 150 is disposed in the metal wiring layer M7 and coupled to the SOT induction wiring layer 15 through the selector layer 140, which is disposed in the metal wiring layer M6. The electrode 80 may be electrically coupled to the drain region 112D of the FET 110.

Figure 16:
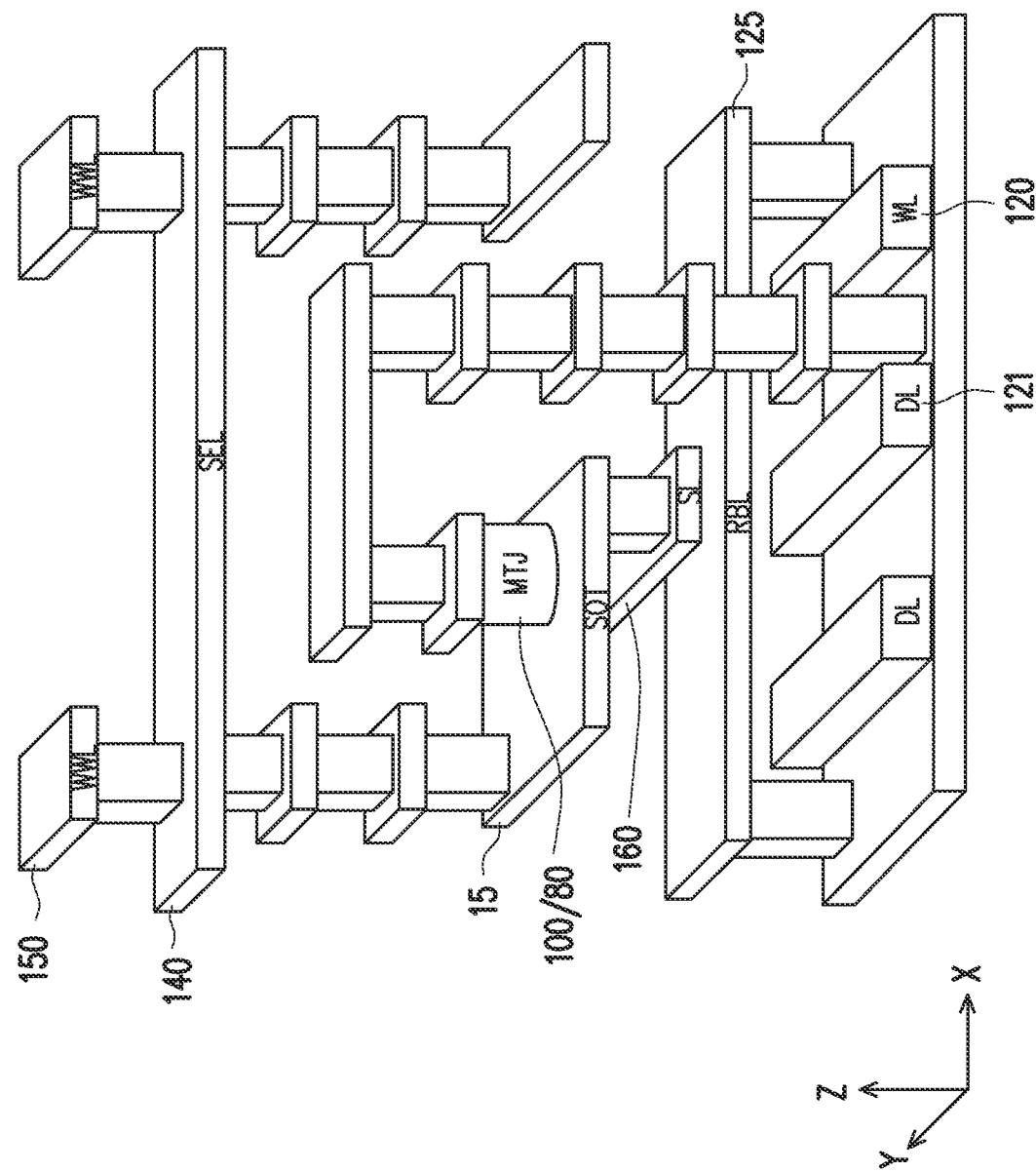

FIG. 16 illustrates a three-dimensional view of the SOT-MRAM cell MC1 and part of the SOT-MRAM cell MC2 of the SOT-MRAM device 1500, in accordance with some embodiments. Materials, configurations, dimensions, processes, and/or operations described with respect to FIGS. 1 through 5 may be employed in the following embodiments, and detailed explanation thereof may be omitted. References to particular elements which are not specifically labelled in FIG. 16 can be found in FIG. 15.

The three-dimensional view of the SOT-MRAM device 1500 is similar to that described above with respect to FIG. 4. As illustrated in FIG. 16, the SOT induction wiring layer 15 is disposed below the MTJ film stack 100 and electrode 80. selector layer 140 is shared between the word write line 150 of one SOT-MRAM cell and the word write line 150 of the adjacent SOT-MRAM cell.

Figure 17:
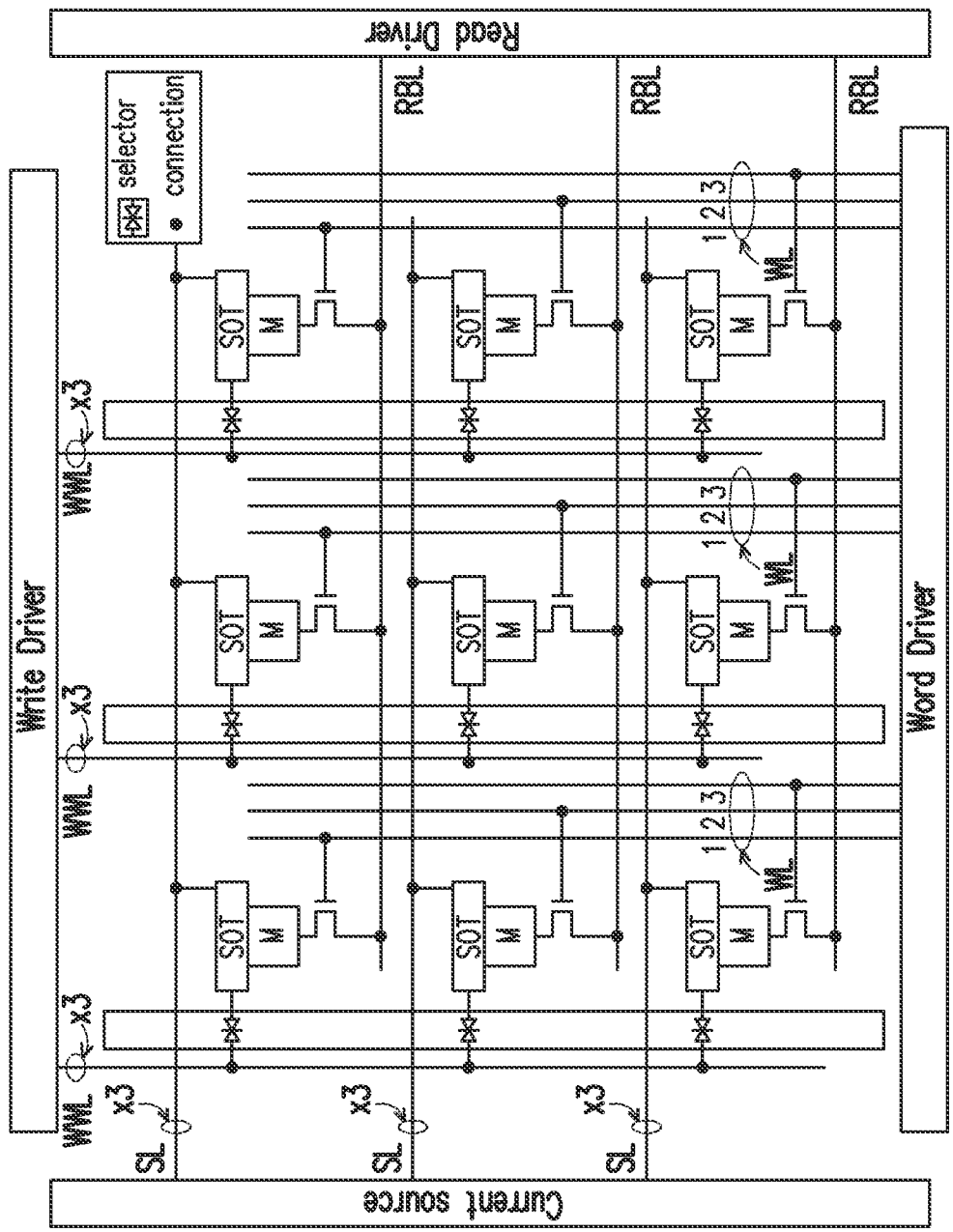
FIG. 17 is a circuit diagram of an SOT-MRAM device according to some embodiments.

FIG. 17 is a circuit diagram of a SOT-MRAM device consistent with the SOT-MRAM device 1500, in accordance with some embodiments. Materials, configurations, dimensions, processes, and/or operations described with respect to FIGS. 1-5 may be utilized in the following embodiments, and detailed explanation thereof may be omitted.

In this embodiment, horizontally adjacent SOT-MRAM cells along the row direction are coupled to the same read bit line RBL. The SOT-MRAM cells are coupled to different word lines WL. In some embodiments, the word lines WL with the same number may be the same word line WL. For example, all of the word lines WL1 may be the same line, all of the word lines WL2 may be the same line, and all of the word lines WL3 may be the same line. The write word lines WWL are indicated by "x3" to convey three separate lines to separately connect from a write driver to the SOT layer through a selector. The connection points along the WWL lines are offset to indicate that they are each connected to different ones of the WWL lines. The selectors are coupled together. The source lines SL are indicated by "x3" to convey three separate lines to separately connect from a current source to the SOT layer for each row. In some embodiments the source lines SL or word write lines WWL may be coupled together, as indicated in the previously discussed embodiments.

Referring to FIG. 18, two SOT-MRAM cells 90 of the SOT-MRAM device 1500 are illustrated, including MC1 and MC2. Materials, configurations, dimensions, processes, and/or operations described with respect to FIGS. 1 through 5 may be utilized in the following embodiments, and detailed explanation thereof may be omitted. In particular, the SOT-MRAM device 1800 is similar to the SOT-MRAM device 1500 of FIG. 15. In the SOT-MRAM device 1800, however, the selector layer 140 is moved below the SOT induction wiring layer 15 and the write word line WWL 150 is moved below the selector layer 140 and may be in the same metal wiring layer as the select line SL 160. Fewer metal wiring layers are required to form the SOT-MRAM device 1800 than the SOT-MRAM device 1500. In some embodiments the write word line 150 of adjacent SOT-MRAM cells (e.g., MC1 and MC2) may be joined together to share the same write word line 150. In some embodiments, the source line 160 of adjacent SOT-MRAM cells (e.g., MC1 and MC2) may be joined together to share the same source line 160. The manufacture of the SOT-MRAM device 1500 may be simplified as a result of these aspects as well as the shared selector layer 140.

In one embodiment the bit line 125 is in the metal wiring layer M0, the source line 160 is in the metal wiring layer M1. The source line 160 is coupled to the SOT induction wiring layer 15 in the metal wiring layer M3. The write word line 150 is disposed in the metal wiring layer M1 and coupled to the SOT induction wiring layer 15 through the selector layer 140, which is disposed in the metal wiring layer M2. The electrode 80 may be electrically coupled to the drain region 112D of the FET 110.

Figure 19:
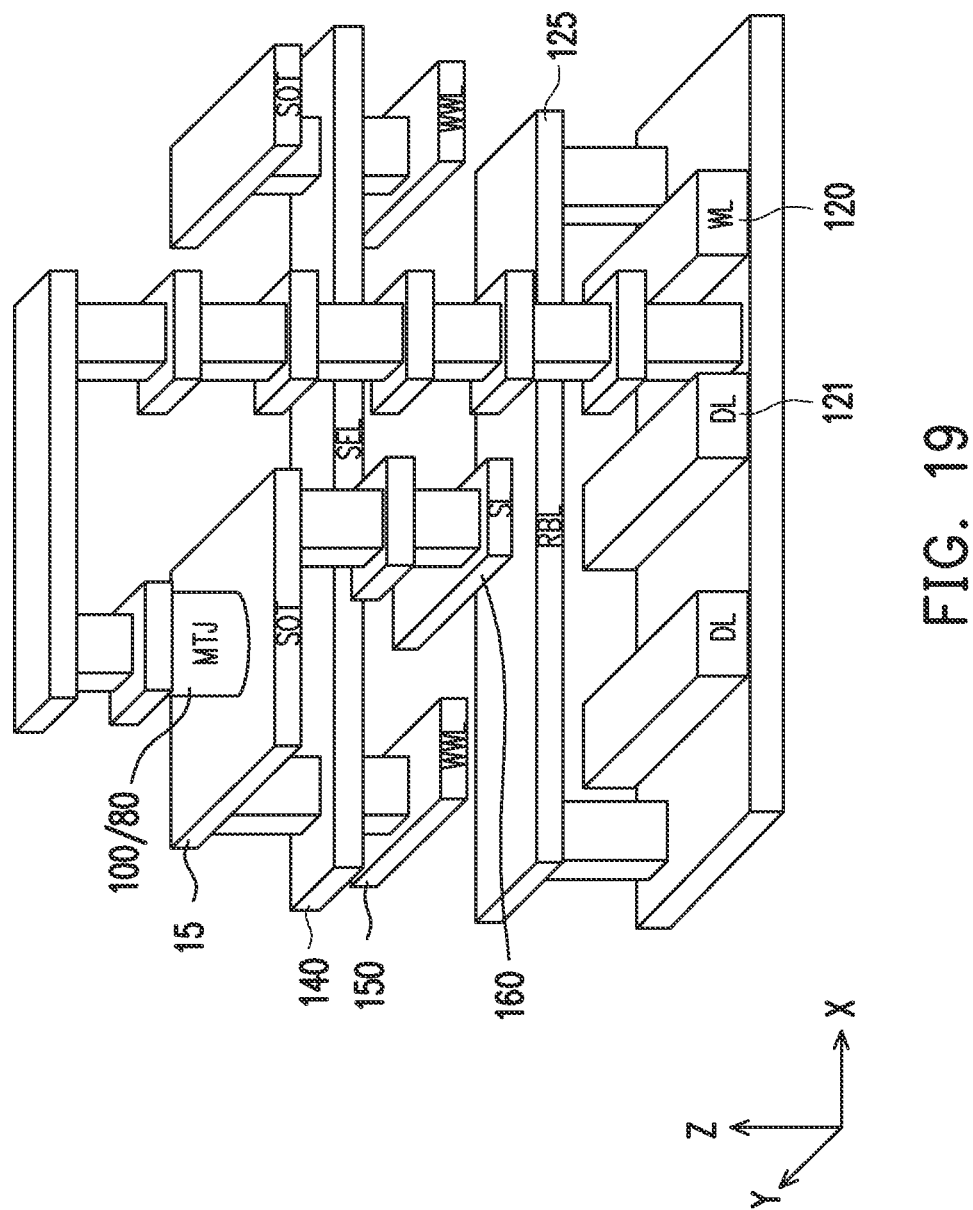

FIG. 19 illustrates a three-dimensional view of the SOT-MRAM cell MC1 and part of the SOT-MRAM cell MC2 of the SOT-MRAM device 1500, in accordance with some embodiments. Materials, configurations, dimensions, processes, and/or operations described with respect to FIGS. 1 through 5 may be employed in the following embodiments, and detailed explanation thereof may be omitted. References to particular elements which are not specifically labelled in FIG. 19 can be found in FIG. 18.

The three-dimensional view of the SOT-MRAM device 1500 is similar to that described above with respect to FIG. 4. As illustrated in FIG. 16, the SOT induction wiring layer 15 is disposed below the MTJ film stack 100 and electrode 80. selector layer 140 is shared between the word write line 150 of one SOT-MRAM cell and the word write line 150 of the adjacent SOT-MRAM cell.

FIGS. 20 through 29 illustrate intermediate steps in the formation of the SOT-MRAM device 300 of FIG. 3. The processes described in the formation of the SOT-MRAM device 300 may be used in like manner to form the SOT-MRAM device 600 of FIG. 6, the SOT-MRAM device 900 of FIG. 9, the SOT-MRAM device 1200 of FIG. 12, the SOT-MRAM device 1500 of FIG. 15, and the SOT-MRAM device 1800 of FIG. 18. The materials which may be used to form the various structures and elements of the SOT-MRAM device 300 are described above and are not repeated.

Figure 20:
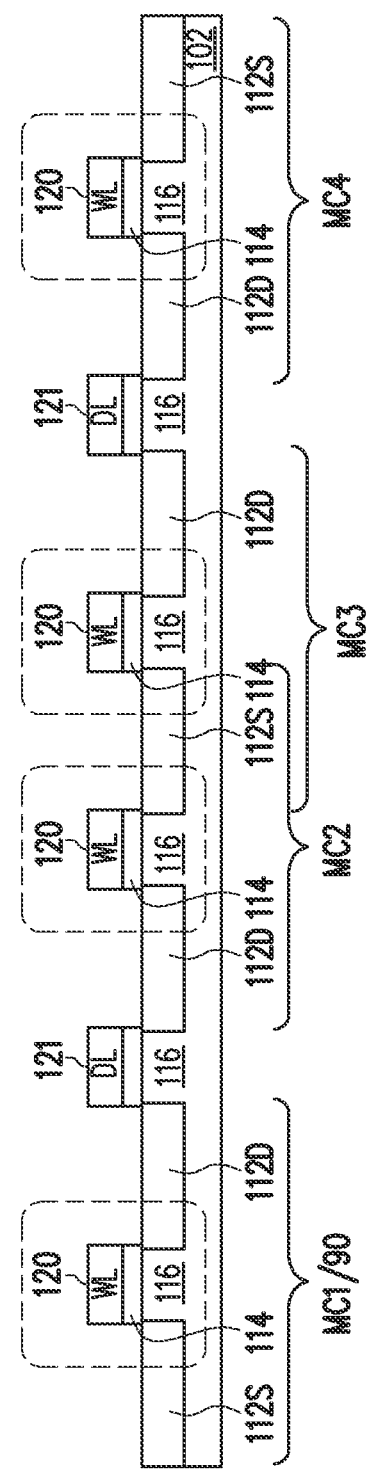

FIG. 20 illustrates a cross-sectional view of a substrate 102 and multiple FETs 110 formed on the substrate 102, in accordance with some embodiments. The FETs 110 are part of the subsequently formed SOT-MRAM cells 90 of the SOT-MRAM device 300. Some example FETs 110 are indicated in FIG. 20. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, the FETs 110 are Fin Field-Effect Transistors (FinFETs) comprising fins 116, gate structures 114, and source regions 112S and drain regions 112D. As shown in FIG. 20, the fins 116 are formed on the substrate 102 and may comprise the same material as the substrate 102 or a different material. In some embodiments, dummy fins (not shown) may be formed between some fins 116 to improve process uniformity. The gate structures 114 are formed over multiple fins 116 and extend in a direction perpendicular to the fins 116. In some embodiments, spacers (not shown in the Figures) may be disposed on the sidewalls of the gate structures 114. In some embodiments, dummy gate structures 21 may be formed between some gate structures 114 to improve process uniformity. The dummy gate structures 21 may be considered "dummy transistors" or "dummy FinFETs," in some embodiments. Some gate structures 114 are used as Word Lines in the SOT-MRAM device 300 (described in greater detail below), and have been labeled as "WL" accordingly. The source regions 112S and the drain regions 112D are formed in the fins 116 on either side of the gate structures 114. The source regions 112S and the drain regions 112D may be, for example, implanted regions of the fins 116 or epitaxial material grown in recesses formed in the fins 116. In the embodiment shown in FIG. 20, one side of each fin 116 is adjacent source regions 112S and the other side of each fin 116 is adjacent drain regions 112D.

The FETs 110 shown in the Figures are representative, and some features of the FETs 110 may have been omitted from the Figures for clarity. In other embodiments, the arrangement, configuration, sizes, or shapes of features such as fins 116, dummy fins, gate structures 114, dummy gate structures 21, source regions 112S, drain regions 112D, or other features may be different than shown. In other embodiments, the FETs 110 may be another type of transistor, such as planar transistors.

Figure 21:
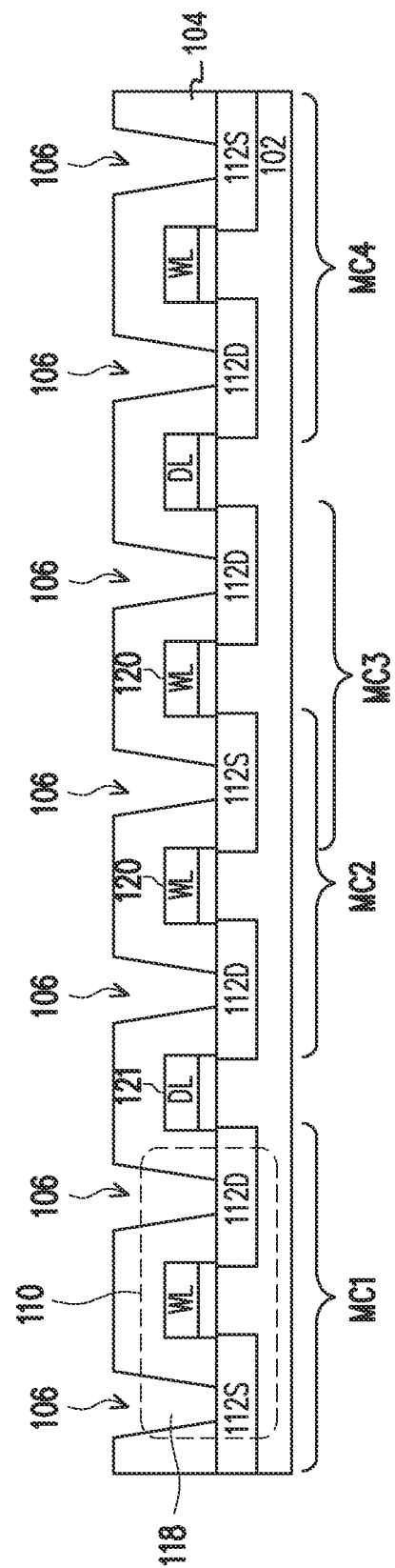

In FIG. 21, a dielectric layer 104 is formed over the substrate 102 and patterned to expose the source regions 112S and drain regions 112D, in accordance with some embodiments. The dielectric layer 104 may cover the FETs 110, and may be considered an Inter-Layer Dielectric layer (ILD) in some embodiments. The dielectric layer 104 may be formed of any suitable dielectric material including, for example, any of the materials listed above for an ILD. The dielectric layer 104 may be formed using any acceptable deposition process, such as spin coating, physical vapor deposition (PVD), chemical vapor deposition (CVD), the like, or a combination thereof. In some embodiments, the dielectric layer 104 may be a low-k dielectric material, such as a dielectric material having a dielectric constant (k value) lower than about 3.0, for example.

The dielectric layer 104 may be patterned to form openings 106 that expose the source regions 112S and the drain regions 112D for subsequent formation of contact plugs 118 (see FIG. 3). The dielectric layer 104 may be patterned using a suitable photolithography and etching process. For example, a photoresist structure (not shown) may be formed over the dielectric layer 104 and patterned. The openings 106 may be formed by etching the dielectric layer 104 using the patterned photoresist structure as an etching mask. The dielectric layer 104 may be etching using a suitable anisotropic etching process, such as a wet etching process or a dry etching process.

Figure 22:
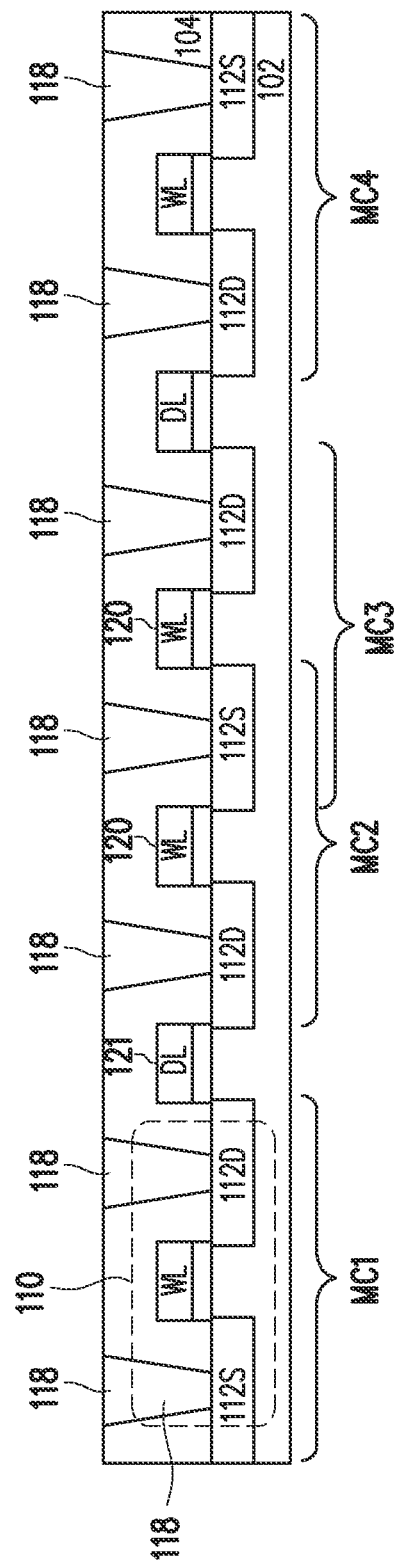

Turning to FIG. 22, contact plugs 118 are formed to make electrical connection to the source regions 112S and the drain regions 112D, in accordance with some embodiments. In some embodiments, the contact plugs 118 are formed by depositing a barrier layer (not individually shown) extending into the openings 106, depositing a conductive material over the barrier layer, and performing a planarization process such as a Chemical Mechanical Polish (CMP) process or a grinding process to remove excess portions of the blanket conductive barrier layer and the conductive material. The barrier layer and conductive material are described above with respect to FIGS. 3, 6, 9, 12, 15, and 18. The barrier layer or the conductive material of the contact plugs 118 may be formed using a suitable process such as Chemical Vapor Deposition (CVD), Physical Vapor Deposition (PVD), Atomic Layer Deposition (ALD), plating, or the like.

Figure 23:
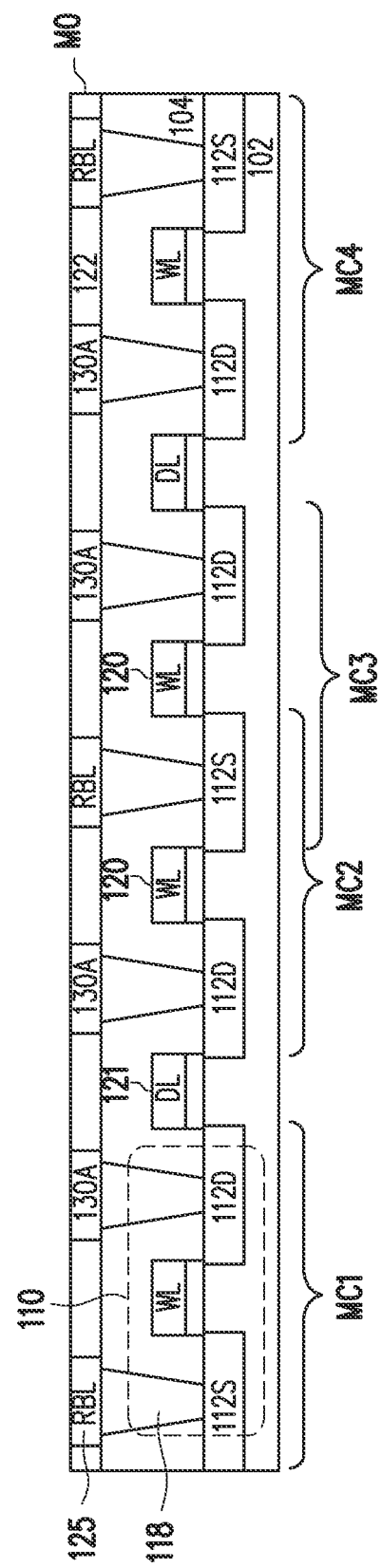

Turning to FIG. 23, conductive lines 130A are formed to electrically connect the contact plugs 118 and provide electrical routing within the SOT-MRAM device. The conductive lines 130A may be formed within a dielectric layer 122 that is formed over the dielectric layer 104. The dielectric layer 122 may be a material similar to those described above for dielectric layer 104 (see FIGS. 2A-2B), and may be deposited using similar techniques as dielectric layer 104. The dielectric layer 122 may be considered an Inter-Metal Dielectric layer (IMD) in some embodiments.

The conductive lines 130A may be formed using a suitable technique such as damascene, dual-damascene, plating, deposition, the like, or combinations thereof. In some embodiments, the conductive lines 130A are formed by first depositing the dielectric layer 122 and patterning the dielectric layer 122 to form openings (e.g., using a suitable photolithography and etching process), and then filling the openings in the dielectric layer 122 with conductive material. For example, the conductive lines 130A may be formed by depositing an optional blanket barrier layer (not individually shown) over the patterned dielectric layer 122, depositing a conductive material over the blanket barrier layer, and performing a planarization process such as a CMP process or a grinding process to remove excess portions of the blanket conductive barrier layer and the conductive material. The barrier layer or the conductive material may be similar to those described above for the contact plugs 118 (see FIG. 22), and may be deposited using similar techniques. In some embodiments, the conductive material of the contact plugs 118 and the conductive lines 130A may be deposited in the same step, for example, if a dual-damascene process is used to form the contact plugs 118 and the conductive lines 130A.

In some embodiments, the conductive lines 130A are formed by first depositing the optional blanket barrier layer over the dielectric layer 104 and contact plugs 118, depositing a conductive material over the blanket barrier layer, and then patterning the barrier layer and conductive material (e.g., using a suitable photolithography and etching process) to form the conductive lines 130A. The dielectric layer 122 may be deposited over the conductive lines 130A and a planarization process performed to expose the conductive lines 130A.

Figure 24:
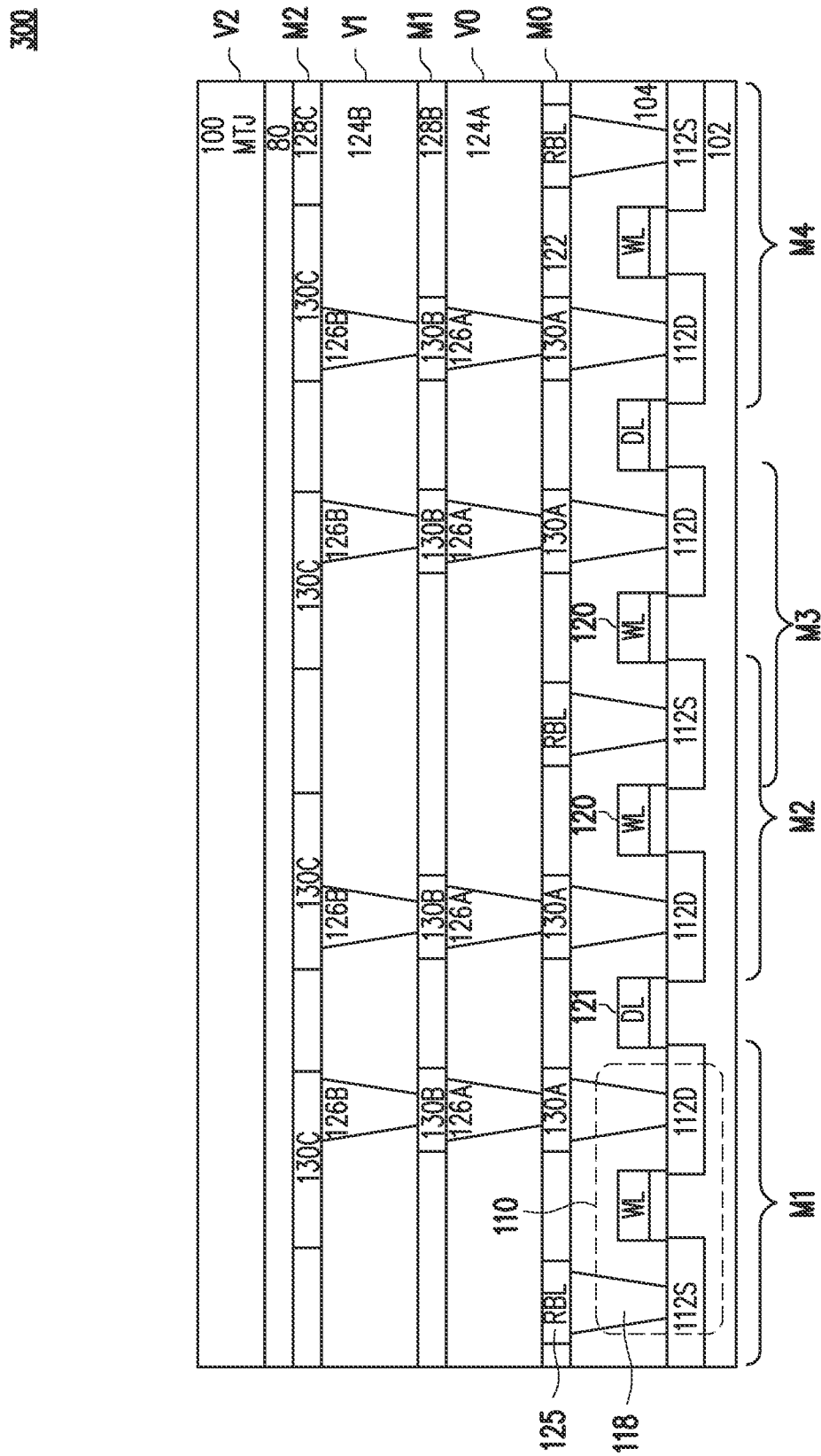

In FIG. 24, vias 126A are formed within a dielectric layer 124A to make electrical connection to the conductive lines 130A, in accordance with some embodiments. In some embodiments, the dielectric layer 124A is first formed over the conductive lines 130A and the dielectric layer 122. The dielectric layer 124A may be a material similar to those described above for the dielectric layer 104 and the vias 126A may be formed using processes and materials similar to those described above with regard to the contact plugs 118. The process of forming conductive lines and vias are repeated to form a desired number of metal wiring layers.

As illustrated in FIG. 24, after forming the conductive lines 130C, the electrode 80 and MTJ film stack 100 is formed. FIGS. 25A through 25K detail the formation of the electrode 80 and the MTJ film stack 100.

FIGS. 25A through 25G show a sequential manufacturing operation for an SOT-MRAM cell according to some embodiments. It is understood that in the sequential manufacturing process, one or more additional operations can be provided before, during, and after the stages shown in FIGS. 25A through 25G, and some of the operations described below can be replaced or eliminated. The order of the operations/processes may be interchangeable. In particular, the process described produces a bottom pinned MTJ film stack 100. The process may be readily adjusted to produce a top pinned MTJ film stack 100 used in some embodiments. Materials, configurations, dimensions, processes and/or operations described with respect to FIGS. 1 through 3 may be employed in the following embodiments, and detailed explanation thereof may be omitted.

As shown in FIG. 25A, a hard mask layer 220 is formed over an n-th wiring layer including a conductive line 130$a$ embedded in an interlayer dielectric (ILD) layer 126$a$. In some embodiments, n is 3, 4, 5 or 6. The symbol $\alpha$ corresponds to the corresponding alphabetic designation, e.g., where n=3, $\alpha$=D. In some embodiments, the hard mask layer 220 includes a first layer 222, a second layer 224 and a third layer 226. In some embodiments, the first to third layers are made of one of silicon oxide, silicon nitride, SiC, SiCN, aluminum oxide, zirconium oxide or any other suitable dielectric material. In certain embodiments, the first and third layers 222 and 226 are made of SiC and the second layer 224 is made of silicon oxide.

The hard mask layer 220 is patterned to form an opening, so as to at least partially expose the upper surface of the conductive line 130$a$ by using one or more lithography and etching operations. A liner layer 230 is formed in the opening and a conductive layer is deposited over the liner layer 230 to form an electrode 240, as shown in FIG. 25B. In some embodiments, the liner layer 230 is made of Ti, Ta or TaN and the conductive layer of the electrode 240 is made of TiN. After the electrode 240 is formed, a planarization operation, such as chemical mechanical polishing (CMP), is performed to level the electrode 240, as shown in FIG. 25C. The electrode 240 may perform as a via for the MTJ film stack 100.

Subsequently, layers for the MTJ film stack 100 are formed over the electrode 240 as shown in FIG. 25D. In FIGS. 25D through 25G, the electrode 240, the metal wiring 210 and the ILD layer 200 are omitted. The layers for the MTJ film stack may include the layers as described above with respect to FIG. 1, including a bottom electrode 80, a buffer or seed layer 70, a SAF layer 60, a spacer layer 45, a reference layer 40, a barrier layer 30, a free layer 20, and an interface layer 50. In some embodiments, a CMP stop layer and a hard mask layer HM are formed over the interface layer, in some embodiments. Each of the layers of the MTJ film stack can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

Then, the stacked layers for the MTJ film are patterned into the MTJ film stacks 100 by using one or more lithography and etching operations, as shown in FIG. 25E. In some embodiments, as shown in FIG. 25E, the cross-sectional view of the MTJ film stack 100 has a tapered (mesa) shape. Then, one or more dielectric material layers 124$a$, including any of the ILD candidate materials described above, are formed to fully cover the MTJ film stack 100, as shown in FIG. 25F. A planarization operation, such as CMP, is performed to expose the uppermost layer of the MTJ film stack 100, as shown in FIG. 25G.

Figure 26:
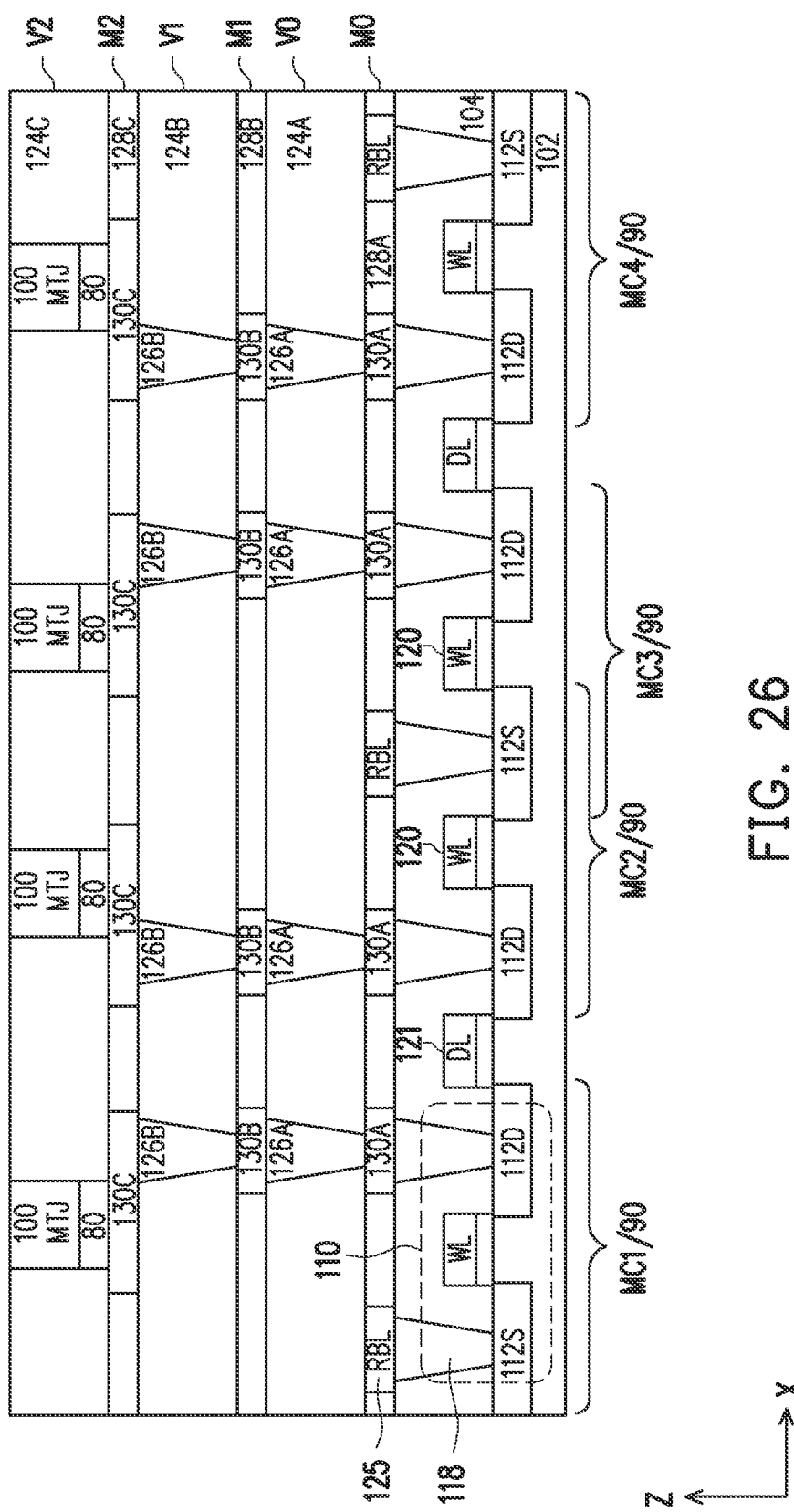

FIG. 26 illustrates the SOT-MRAM device 300 following the patterning of the MTJ film stacks 100. After forming the MTJ film stacks 100, additional vias (e.g., vias 126D in FIG. 15) through the ILD 124C may be formed as necessary using processes similar to those described above for the contact plugs 118, for example.

Figure 27:
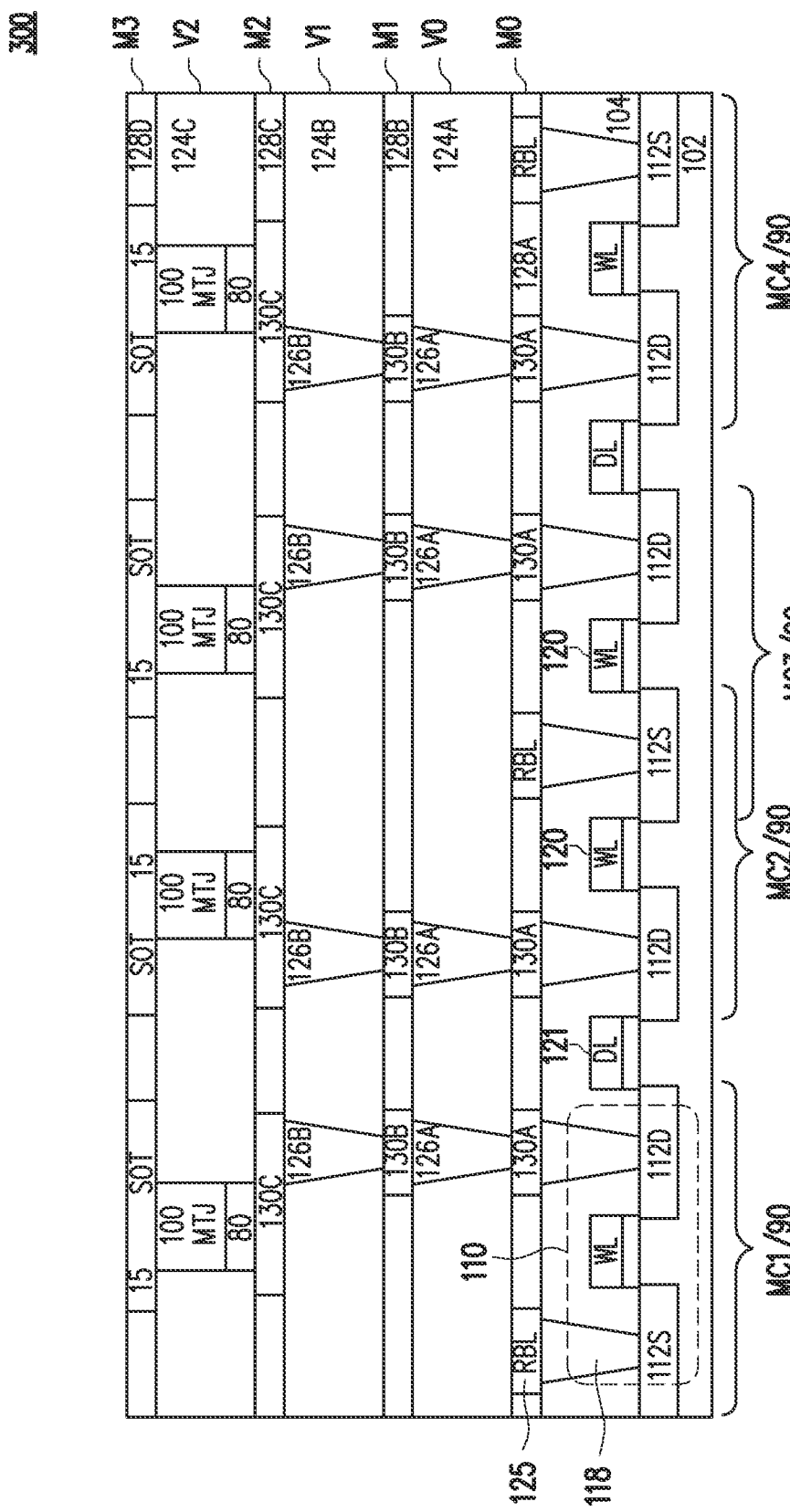

FIG. 27 illustrates the forming of the SOT induction wiring layer 15 over the MTJ film stack 100. In some embodiments, the SOT induction wiring layer 15 is formed over the MTJ film stack 100 prior to forming the dielectric layer 128D, which is formed after the SOT induction wiring layers 15 are formed. In other embodiments, the SOT induction wiring layer 15 may be formed within defined areas of the dielectric layer 128D.

FIGS. 28A through 28D illustrate a sequential manufacturing operation for a SOT-MRAM cell according to some embodiments. It is understood that in the sequential manufacturing process, one or more additional operations can be provided before, during, and after the stages shown in FIGS. 28A through 28D, and some of the operations described below can be replaced or eliminated. The order of the operations/processes may be interchangeable. In particular, the process described produces a SOT induction wiring layer 15 for a bottom pinned MTJ film stack 100. The process may be readily adjusted to produce a SOT induction wiring layer 15 for a top pinned MTJ film stack 100 used in some embodiments. Materials, configurations, dimensions, processes and/or operations described with respect to FIGS. 1 through 3 may be employed in the following embodiments, and detailed explanation thereof may be omitted.

Figure 28A:
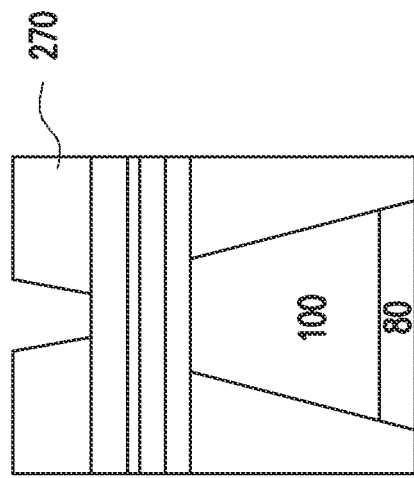

In FIG. 28A, a conductive layer 250 for the main SOT induction wiring layer 10 and conductive layers 260 for the top conductive layer 5 (see FIG. 1) are formed. In some embodiments, the conductive layers 260 includes a first conductive layer 262, a second conductive layer 264 as an etching stop layer and a third conductive layer 266. The second conductive layer 264 is made of a different material than the first and the third conductive layers. In some embodiments, the first conductive layer 262 may be omitted.

Figure 28B:
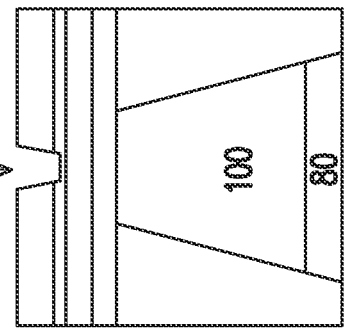
Figure 28C:
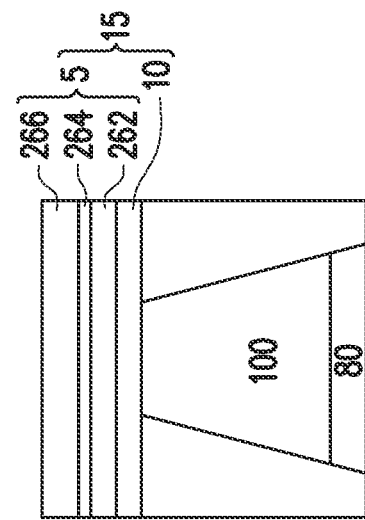
Figure 28D:
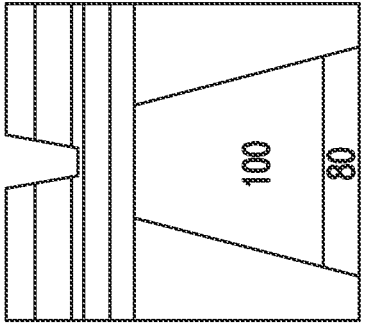

In FIG. 28B, a photo resist pattern 270 is formed over the conductive layers 260, and the conductive layers 260 are patterned by using one or more lithography and etching operations, as shown in FIG. 28C. Then, the photo resist pattern 270 is removed as shown in FIG. 28D. In some embodiments, the etching stops at the second conductive layer 264. In other embodiments, an additional etching is performed so that the first conductive layer 262 is partially etched. As a result of the etching an indentation or dimple 6 may be made in the top conductive layer 5. In some embodiments, before or after the patterning operations shown in FIGS. 28A through 28D, the conductive layers 250 and 260 are patterned to form a line shaped pattern, and the thickness of the conductive layers 260 is reduced by the operations of FIGS. 28A through 28D.

Figure 29A:
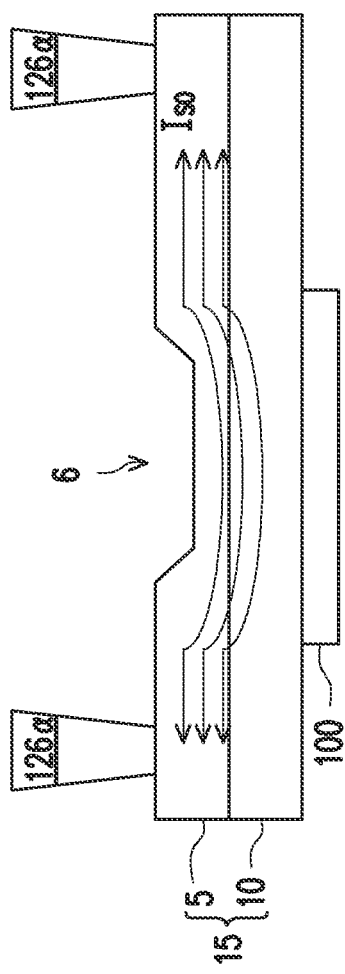

FIG. 29A illustrates another view of the dimple 6, in accordance with some embodiments. In some embodiments, the top conductive layer 5 has a dimple (thin portion) above the MTJ film stack 100, where a thickness of the top conductive layer 5 is smaller than the remaining portion of the top conductive layer 5. This structure allows an increase in current flowing through the main SOT induction wiring layer 10 to cause a sufficient SOT effect, while allowing a low resistance between adjacent cells. In some embodiments, a thickness of the top conductive layer 5 is in a range from about 2 nm to 20 nm in some embodiments and is in a range from about 5 nm to 15 nm in other embodiments, and the thickness of the thin portion of the top conductive layer 5 is about 40% to about 80% of the thickness of the top conductive layer 5 at other than the thin portion.

Figure 29B:
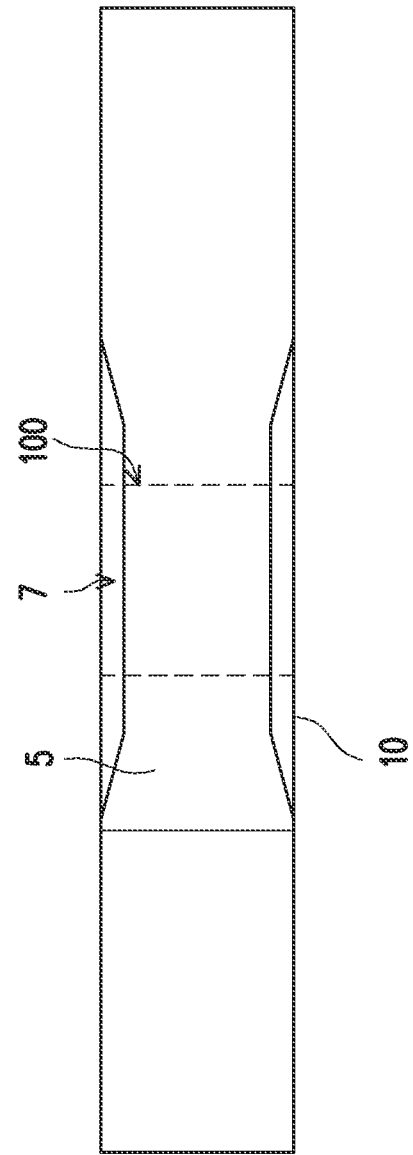

FIG. 29B is a plan view of a SOT-MRAM cell, in accordance with some embodiments. In some embodiments, in addition to or instead of the dimple 6, a narrow portion 7, at which the width of the top conductive layer 5 is narrower above the MTJ film than the remaining portion of the top conductive layer 5, is provided. The width of the narrow portion 7 of the top conductive layer 5 is about 50% to about 90% of the width of the top conductive layer 5 at other than the narrow portion 7.

In embodiments where the SOT induction wiring layer 15 is disposed under the MTJ film stack 100, the dimple 6 and/or narrow portion 7 may be maintained in the (now bottom) conductive layer 5, the dimple 6 being in the lower surface of the inverted SOT induction wiring layer 15. In such embodiments, the dimple 6 may be formed by patterning a dielectric bump where the dimple 6 is to go. Then the conductive layers of the (now bottom) conductive layer 5 may be formed over the dielectric bump and then planarized prior to forming the main SOT induction wiring layer 10.

In embodiments where the SOT induction wiring layer 15 has a via 126a on one end and a via 126a-1 on the other end (such that the two vias lead in opposite vertical directions from each other), the top conductive layer 5 may be extended wider than the main SOT induction wiring layer 10 so that the vias electrically couple to the top conductive layer 5.

Figure 30A:
Figure 30B:
Figure 30C:

FIGS. 30A-30C shows various structures for the main SOT induction wiring layer 10. In some embodiments, the main SOT induction wiring layer 10 is a single layer of heavy metal, such as Pt, W, Ta and Mo, as shown in FIG. 30A. In other embodiments, the SOT induction wiring layer 10' is a single layer of antiferromagnetic material, such as IrMn, as shown in FIG. 30B. In other embodiments, the SOT induction wiring layer 10" is a bi-layer of heavy metal layer 11 and an antiferromagnetic material layer 12, where the heavy metal layer 11 is in contact with the MTJ film stack, as shown in FIG. 30C.

Figure 31:
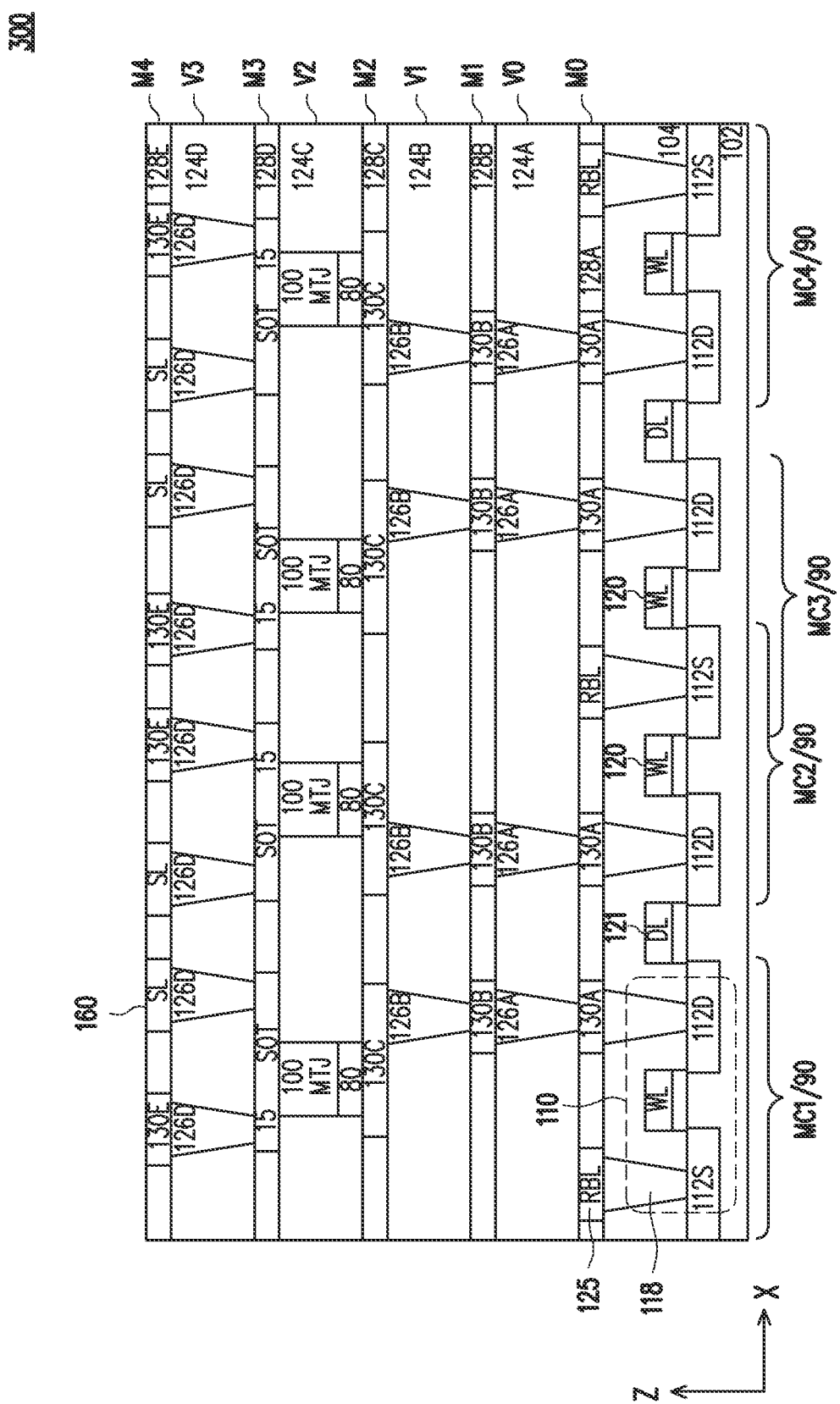

In FIG. 31, vias 126D are formed within a dielectric layer 124D to make electrical connection from the conductive lines 130E to the SOT induction wiring layer 15, in accordance with some embodiments. In some embodiments, the dielectric layer 124D is first formed over the SOT induction wiring layer 15 and the dielectric layer 128D. The dielectric layer 124D may be a material similar to those described above for the dielectric layer 104 and the vias 126D may be formed using processes and materials similar to those described above with regard to the contact plugs 118. The process of forming conductive lines and vias are repeated to form a desired number of metal wiring layers. The source line 160 is coupled to one end of the SOT induction wiring layer 15. A conductive line is coupled to the other end of the SOT induction wiring layer 15.

Figure 32:
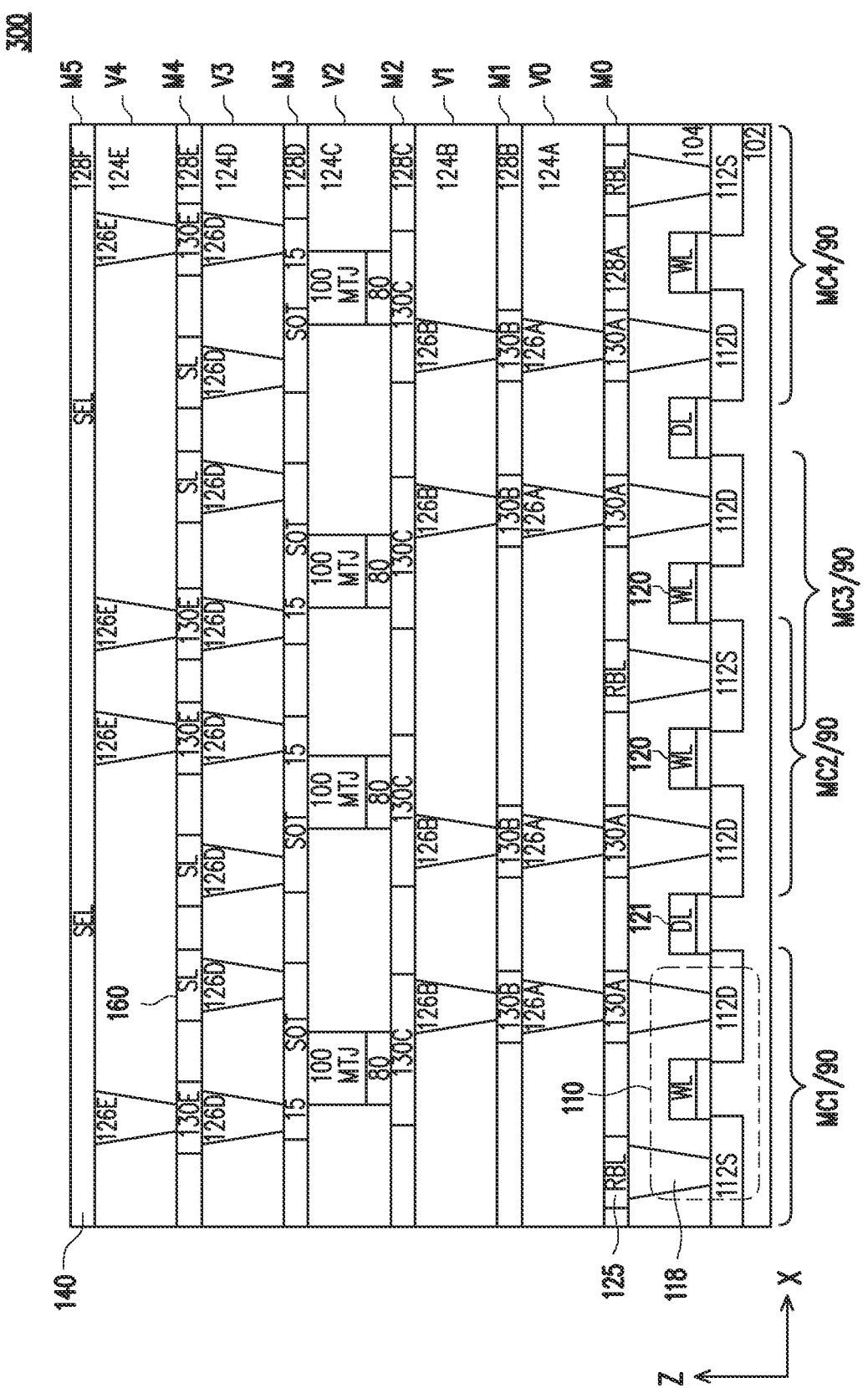

In FIG. 32, vias 126E are formed within a dielectric layer 124D to make electrical connection from the selector layer 140 to the conductive line 130E. The selector layer 140 may be formed by depositing the material of the selector layer 140 over the dielectric layer 124E. The selector layer 140 may be deposited using any suitable technique, such as by CVD, PVD, ALD, and so forth. The selector layer 140 may be made of any of the materials discussed above with respect to FIG. 1. The selector layer 140 may be in-situ doped or doped in a separate doping process to introduce dopant to the selector layer 140 material up to a desired concentration.

In some embodiments, a bottom electrode may first be formed over the vias 126D. An example process for forming bottom electrodes is discussed with respect to FIGS. 33A through 33F. In some embodiments a particular metal may be used for some or all of the vias 126D which can serve as a bottom electrode layer for the selector layer 140. In some embodiments, the material of the selector layer 140 may be deposited and then the portions to remove selectively removed to form the selector layer 140 lines, following which the dielectric layer 128F may be deposited and planarized to level the upper surfaces. In other embodiments, the dielectric layer 128F may be formed first, openings patterned therein, the selector layer 140 deposited in the openings, and the structure planarized to level the upper surfaces.

Figure 33A:
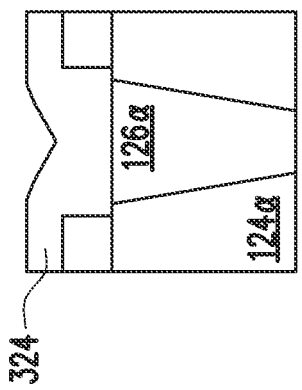

In FIGS. 33A through 33F a process of forming a bottom electrode is described, in accordance with some embodiments. In FIG. 33A a dielectric material 320 may be deposited. The dielectric material 320 may be a hard mask layer and may include multiple sub layers, such as a first, second, and third sublayer. The dielectric material layer may include silicon oxide, silicon nitride, SiC, SiCN, aluminum oxide, zirconium oxide or any other suitable dielectric material, and may be deposited using any suitable technique such ALD, PVD, CVD, and the like.

Figure 33B:
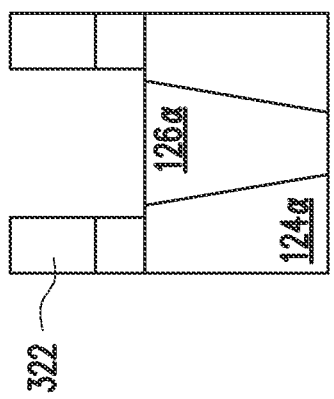
Figure 33C:
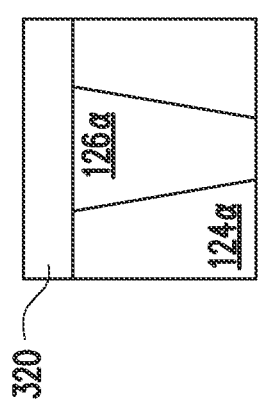

In FIG. 33B, a photo mask 322 is formed over the dielectric material 320 and patterned. Then the dielectric material 320 is etched to form an opening which exposes the upper surface of the via 126a. The symbol α corresponds to a corresponding alphabetic designation of a metal wiring layer Mn, e.g., where n=3, α=D. In FIG. 33C, a conductive material for the bottom electrode 324 is deposited using any suitable technique, such as be CVD, PVD, ALD, or the like. In some embodiments the conductive material of the bottom electrode 324 may include a single layer or multi-layer of Ti, Ta, TiN, TaN, W, Cu, the like, or combinations thereof.

Figure 33D:
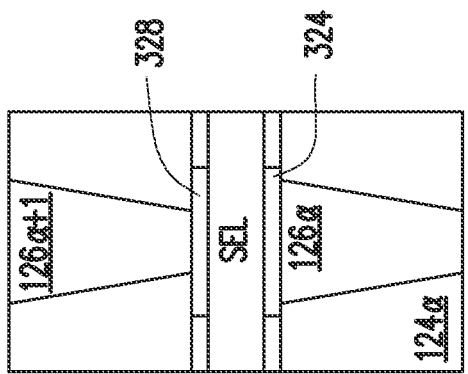
Figure 33E:
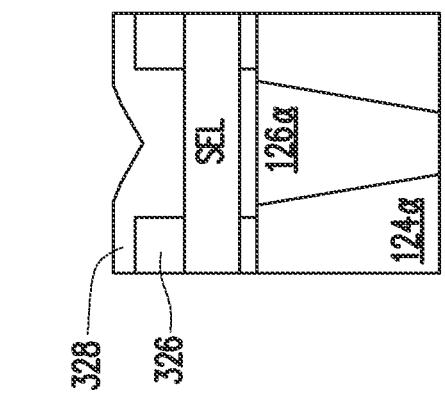
Figure 33F:
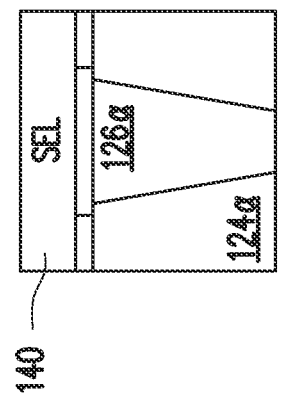

In FIG. 33D, the conductive material of the bottom electrode 324 is planarized and the selector layer 140 is deposited over the electrode and a portion of the dielectric material 320. In some embodiments, an optional top electrode 328 may also be formed. In FIG. 33E, a dielectric material 326 may be deposited and patterned using like processes and materials as the dielectric material 320 to form an opening therein to expose the selector layer 140. A conductive material of the top electrode 328 may be deposited in the opening in the dielectric material 326. The conductive material of the top electrode 328 may be formed using processes and materials similar to the bottom electrode 324. In FIG. 33F, the top electrode 328 may be planarized and additional vias or metal wiring layers may be formed, in accordance with some embodiments.

Figure 34:
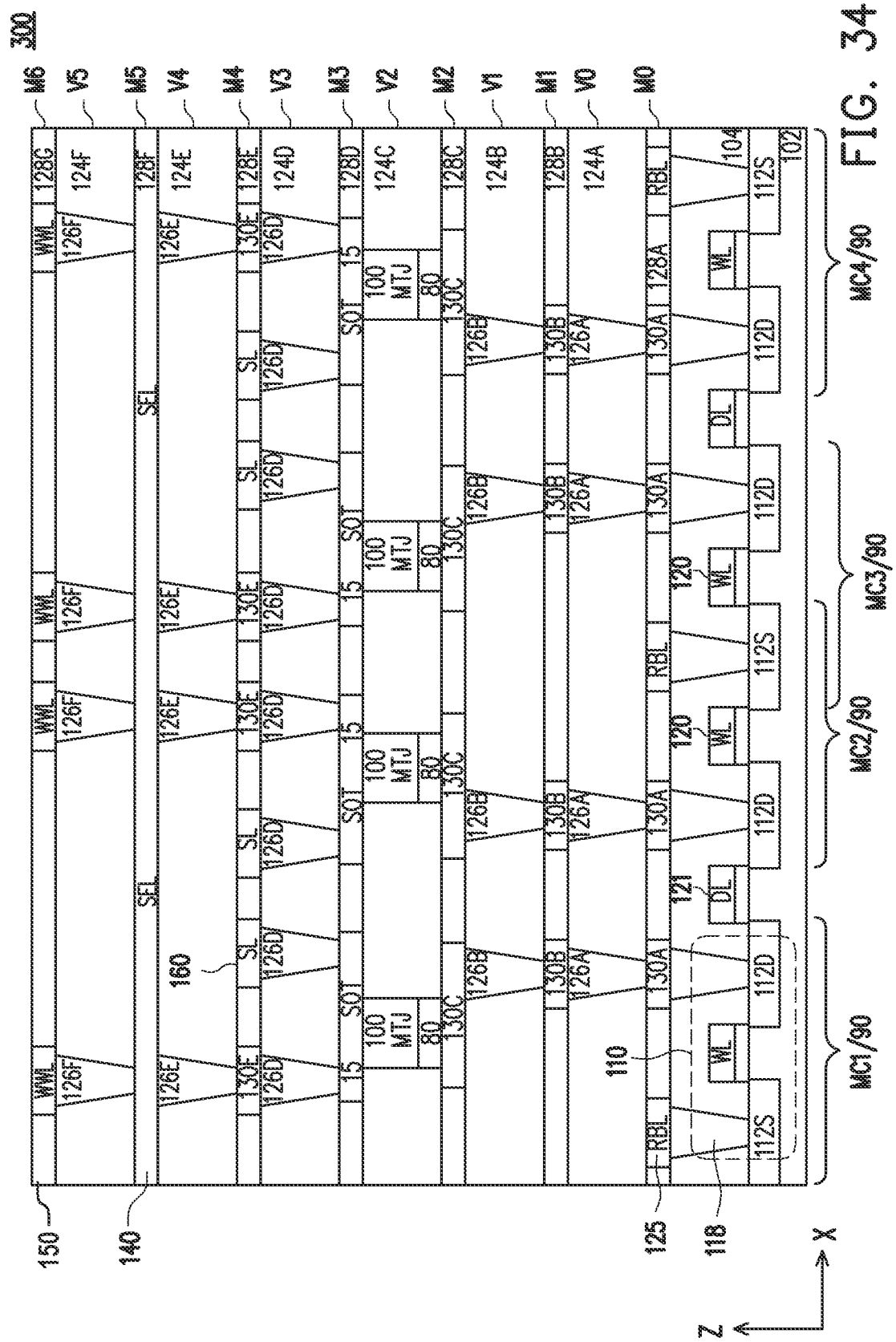

In FIG. 34, vias 126F are formed within a dielectric layer 124F to make electrical connection from the selector layer 140 to the write word lines WWL 150, in accordance with some embodiments. The dielectric layer 124D may be formed using materials and processes similar to those described above for the dielectric layer 104 and the vias 126D may be formed using processes and materials similar to those described above with regard to the contact plugs 118. In some embodiments, the via directly over the selector layer 140, i.e., the via 126F, may be made of a top electrode material for the selector layer 140. The process of forming conductive lines and vias are repeated to form a desired number of metal wiring layers. The write word line 150 is coupled to one end of the SOT induction wiring layer 15 by way of the selector layer 140.

Figure 35:
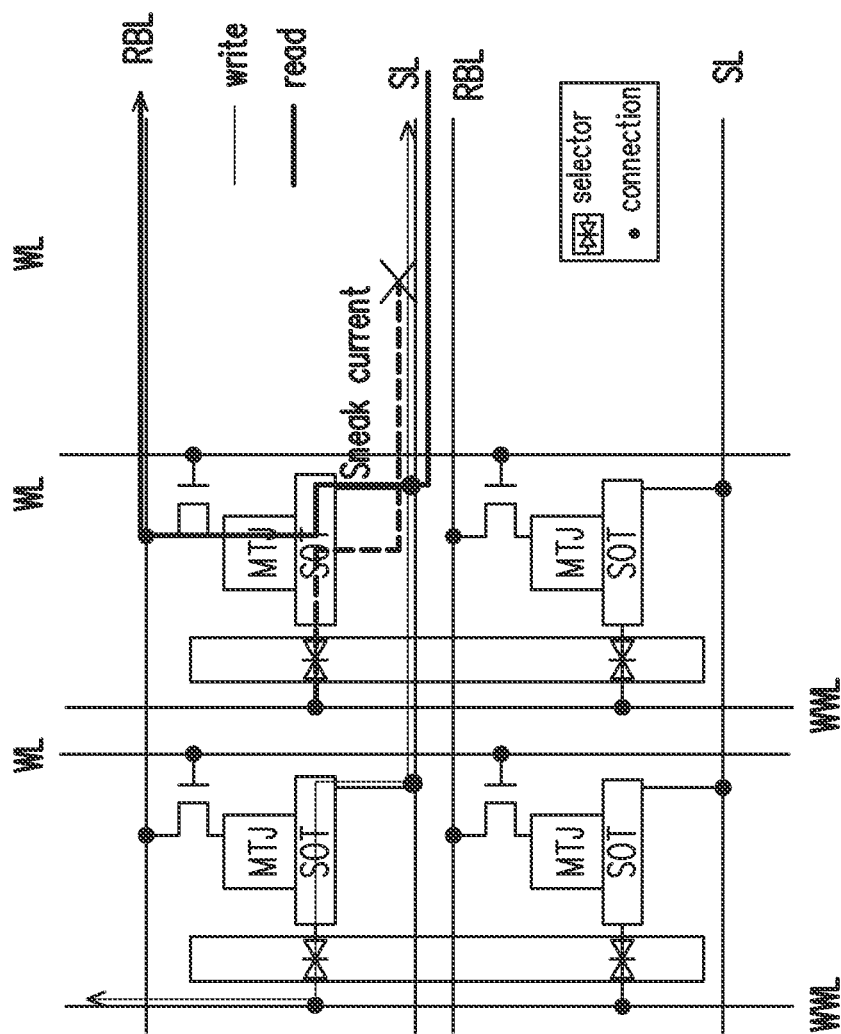
FIGS. 35 and 36 illustrate operations of an SOT-MRAM cell according to some embodiments.
Figure 36:
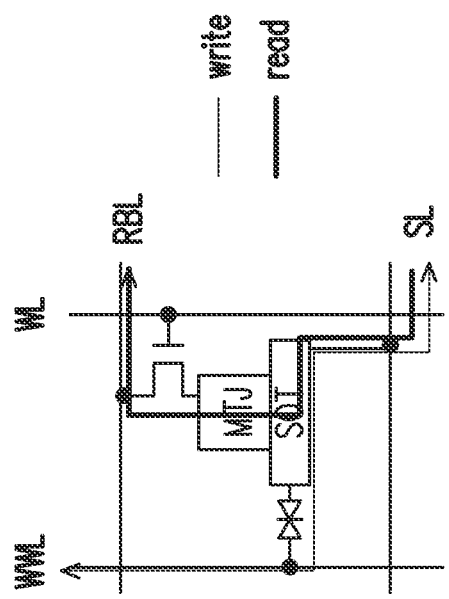

FIGS. 35 and 36 show operations of an SOT-MRAM cell according to an embodiment of the present disclosure. In a writing operation, a write current flows through the SOT induction wiring SOT. When writing a first type of data (e.g., "0") to the MTJ film stack 100, the word line WL and the write word line WWL are set to a first potential (e.g., ground or 0 V), and the source line SL is set to a write voltage Vw higher than a threshold voltage of the selector layer 140. With this write voltage, the selector layer 140 is turned on to flow a current from the source line SL to the write word line WWL through the SOT induction wiring SOT and the selector layer 140. Since the FET 110 is off, no current flows through the MTJ film stack 100

When writing a second type of data (e.g., "1") to the MTJ film stack 100, the word line WL is set to a second potential (e.g., Vdd) higher than the first potential, the source line SL is set to the first potential (e.g., ground or Vss), and the write word line WWL is set to the high voltage Vw. With this high voltage, the selector layer 140 is turned on to flow a current from the write word line WWL to the source line SL through the SOT induction wiring SOT and the selector layer 140. In other words, the current flow directions in the SOT induction wiring SOT are opposite to each other for the writing the first type data and the second type data. Since the FET 110 is off, no current flows through the MTJ film stack 100. During the write operations, the read bit line RBL is floating in some embodiments. The operation table shown in FIG. 9 can also be inversed according to the polarity of the spin Hall angle in some embodiments. Namely, the spin Hall angle can be either positive or negative and the write operations are opposite to each other.

When reading data from the MTJ film stack 100, the word line WL is set to the second potential, the source line SL is set to the first potential, and the read bit line RBL is set to the read voltage Vread. The amplitude of Vread is about ½ to about ⅕₀ of Vw in some embodiments. In other embodiments, the source line SL is set to the second potential. Since the FET 110 turns on, the read current flows from the source line SL to the read bit line RBL through the SOT induction wiring SOT and the MTJ film stack 100. In such a case, the Vread is lower than the source line voltage (e.g., Vread is negative). In other embodiments, the read current flows from the MTJ film stack 100 to the SOT induction wiring layer 15, in other words, from the read bit line RBL to the source line SL, so that the electrons flow from the free layer to the reference layer. The MTJ film stack 100 is more robust against read disturbance when the electrons flow from the free layer to the reference layer. In such a case, the Vread is higher than the source line voltage (e.g., Vread is positive). During the read operations, the write word line WWL is floating and the selector material layer is not turned on. In some embodiments, substantially no sneak (leak) current flows through the selector layer 140 in the read operation. The sneak current is less than about 10 pA per cell in some embodiments.

In some embodiments, in the read operation, the source line SL connected to the target cell is set to Vdd and the source lines connected to the other cell are set to Vdd/2. The word line connected to the target cell is set to 0 V and the word lines connected to the other cells are set to Vdd/2. With this configuration, the sneak current can further be reduced.

Embodiments advantageously use a shared selector layer as a switching device coupled to the SOT induction wiring for a multitude of memory cells, while a transistor (e.g., a FET) is used as a switching device coupled to the bottom of the MTJ film stack 100. Rather than form a selector for each and every cell, the shared selector layer can take advantage of the unique material properties of the shared selector material to provide a shared selector, yet still reduce sneak or leakage current.

One embodiment is magnetic memory device including a first magnetic tunnel junction (MTJ) stack. The magnetic memory device also includes a first spin-orbit torque (SOT) induction wiring disposed over the first MTJ stack. The device also includes a first conductive line coupled to a first end of the first SOT induction wiring. The device also includes a second conductive line coupled to a second end of the first SOT induction wiring. The device also includes a selector layer coupled to the first conductive line. The device also includes and a second SOT induction wiring disposed over a second MTJ stack, the selector layer coupled to a third conductive line coupled to the second SOT induction wiring.

In one embodiment, the magnetic memory device may include a bottom electrode coupled to the first MTJ stack and to a switching device. In one embodiment, the switching device may include a fin field-effect transistor (FET), where the bottom electrode is coupled to a source/drain of the finFET. In one embodiment, the MTJ stack includes a magnetic free layer; a barrier layer disposed under the magnetic free layer; and a magnetic reference layer, disposed under the barrier layer, and the SOT induction wiring is disposed over the free layer. In one embodiment, the MTJ stack further includes an interfacial layer disposed between the free layer and the SOT induction wiring. In one embodiment, the MTJ stack is disposed under the SOT induction wiring between the first conductive line and the second conductive line. In one embodiment, the MTJ stack further includes a synthetic anti-ferromagnetic (SAF) layer below the reference layer, the SAF layer having a different composition than the reference layer. In one embodiment, the selector layer may include hafnium oxide ($HfO_x$, where $0<x\leq 2$). In one embodiment, the selector layer may include a first electrode underlying a selector material layer, where the first electrode is coupled to the first conductive line.

Another embodiment is a magnetic memory device including a first word line, a bit line, a write word line, and a source line. The magnetic memory also includes and a first memory cell, the first memory cell may include a first magnetic tunnel junction (MTJ) stack. The memory cell also includes a first spin-orbit torque (SOT) induction wiring coupled to one end of the first MTJ stack, the first SOT induction wiring having a first end and a second end, the second end coupled to the source line. The memory also includes a selector layer coupled between the first end of the SOT induction wiring and the write word line. The memory also includes and a first switching transistor, a first source/drain of the first switching transistor coupled to the first MTJ stack, a second source/drain of the first switching transistor coupled to the bit line, and a gate of the first switching transistor being coupled to the word line.

In one embodiment, the source line is coupled to a current source. In one embodiment, the magnetic memory may include: a second memory cell, the second memory cell may include: a second magnetic tunnel junction (MTJ) stack; a second spin-orbit torque (SOT) induction wiring coupled to one end of the second MTJ stack, the second SOT induction wiring having a third end and a fourth end; the selector layer coupled to the third end of the SOT induction wiring; and a second switching transistor, a third source/drain of the second switching transistor coupled to the second MTJ stack, a fourth source/drain of the second switching transistor coupled to the bit line, and a gate of the second switching transistor being coupled to the word line. In one embodiment, the fourth end of the SOT induction wiring is coupled to the source line. In one embodiment, the selector layer is coupled to the write word line. In one embodiment, the fourth source/drain and the second source/drain are the same source/drain.

Another embodiment is a method including forming a switching transistor over a substrate. The method also includes depositing conductive vias and conductive lines in a dielectric material to form a plurality of metal wiring layers over the substrate. The method also includes embedding a MTJ film stack in the plurality of metal wiring layers, the MTJ film stack corresponding to a first memory cell. The method also includes depositing a spin-orbit torque (SOT) induction wiring over the MTJ film stack. The method also includes depositing a shared selector layer over the SOT induction wiring and coupling the shared selector layer to one end of the SOT induction wiring, the shared selector layer extending over and coupled to an adjacent second memory cell. The method also includes coupling a source line to another end of the SOT induction wiring. The method also includes coupling a write word line to an upper side of the shared selector layer.

In one embodiment, the method may include: disposing the SOT induction wiring over the MTJ film stack on a line of current path between the source line and the shared selector layer. In one embodiment, the method may include: forming a physical current restriction in an upper layer of the SOT induction wiring. In one embodiment, the method may include: forming a bottom electrode of the shared selector layer over a conductive via coupled to the one end of the SOT induction wiring. In one embodiment, the material of the shared selector layer may include hafnium oxide ($HfO_x$, where $0<x\leq 2$).

Another embodiment is a magnetic memory device including a first magnetic tunnel junction (MTJ) stack. The magnetic memory device also includes a first spin-orbit torque (SOT) induction wiring disposed over on the first MTJ stack. The device also includes a first wiring coupled to a first end of the first SOT induction wiring. The device also includes and a first portion of a selector layer coupled to a second end of the first SOT induction wiring and a second portion of the selector layer coupled to a second end of a second SOT induction wiring, the selector layer extending continuously between the first portion and the second portion.

Another embodiment is a magnetic memory including a write word line wiring. The magnetic memory also includes a first memory cell. The first memory cell may include a first magnetic tunnel junction (MTJ) stack, a first spin-orbit torque (SOT) induction wiring coupled to a first end of the first MTJ stack, and a first selector material coupled between the SOT induction wiring and the write word line wiring.

Another embodiment is a method forming a MTJ film stack over a substrate, the MTJ film stack corresponding to a first memory cell. The method also includes laterally encapsulating the MTJ film stack in a first dielectric layer. The method also includes depositing a spin-orbit torque (SOT) induction wiring over the MTJ film stack. The method also includes depositing a shared selector layer over the SOT induction wiring and coupling the shared selector layer to one end of the SOT induction wiring, the shared selector layer extending over and coupled to an adjacent second memory cell. The method also includes coupling a source line to another end of the SOT induction wiring. The method also includes coupling a write word line to an upper side of the shared selector layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory device comprising:
   a first magnetic tunnel junction (MTJ) stack;
   a first spin-orbit torque (SOT) induction wiring disposed on the first MTJ stack;
   a first wiring coupled to a first end of the first SOT induction wiring; and a first portion of a selector layer coupled to a second end of the first SOT induction wiring and a second portion of the selector layer coupled to a second end of a second SOT induction wiring, the selector layer extending continuously between the first portion and the second portion.

2. The magnetic memory device of claim 1, further comprising:
   a switching device, the first MTJ stack coupled to a first leg of the switching device.

3. The magnetic memory device of claim 2, wherein the selector layer is further from the switching device than the MTJ stack.

4. The magnetic memory device of claim 2, wherein the switching device comprises a transistor.

5. The magnetic memory device of claim 2, wherein a read bit wiring is couple to a second leg of the switching device, the read bit wiring being a shared read bit wiring for a first memory cell associated with the first SOT induction wiring and a second memory cell associated with the second SOT induction wiring.

6. The magnetic memory device of claim 1, wherein the MTJ stack further includes an interfacial layer interposed between a magnetic free layer of the MTJ stack and the first SOT induction wiring.

7. The magnetic memory device of claim 1, wherein the selector layer comprises hafnium oxide ($HfO_x$, where $0<x\leq2$).

8. The magnetic memory device of claim 1, wherein the selector layer comprises a first electrode underlying a selector material layer, wherein the first electrode is electrically coupled to the second end of the first SOT induction wiring.

9. The magnetic memory device of claim 1, further comprising a third portion of the selector layer coupled to a third end of a third SOT induction wiring, the third SOT induction wiring adjacent the first SOT induction wiring, the second SOT induction wiring adjacent the first SOT induction wiring, the first SOT induction wiring and third SOT induction wiring diagonal from each other, the selector layer extending continuously between the first portion, the second portion, and the third portion.

10. A magnetic memory comprising:
    a write word line wiring; and
    a first memory cell, the first memory cell comprising:
      a first magnetic tunnel junction (MTJ) stack,
      a first spin-orbit torque (SOT) induction wiring coupled to a first end of the first MTJ stack, and
      a first selector material coupled between the first SOT induction wiring and the write word line wiring.

11. The magnetic memory of claim 10, further comprising:
    a source line wiring, the source line wiring coupled to the first SOT induction wiring at one side of the first MTJ stack, the first selector material coupled to the first SOT induction wiring at an opposite side of the first MTJ stack.

12. The magnetic memory of claim 10, further comprising:
    a first switching transistor, a first source/drain of the first switching transistor coupled to a second end of the first MTJ stack, a second source/drain of the first switching transistor coupled to a bit line wiring, and a gate of the first switching transistor being coupled to a word line wiring.

13. The magnetic memory of claim 10, further comprising:
    a second write word line wiring; and
    a second memory cell, the second memory cell comprising:
      a second magnetic tunnel junction (MTJ) stack,
      a second SOT induction wiring, and
      a second selector material.

14. The magnetic memory of claim 13, wherein the first selector material is shared with the second memory cell, the first selector material extending continuously to the second selector material.

15. The magnetic memory of claim 13, wherein the first SOT induction wiring is shared with the second SOT induction wiring, the first SOT induction wiring extending continuously to the second SOT induction wiring, a source line wiring coupled to the first SOT induction wiring, wherein the source line wiring is shared with the second memory cell.

16. A method comprising:
    forming a magnetic tunnel junction (MTJ) film stack over a substrate, the MTJ film stack corresponding to a first memory cell;
    laterally encapsulating the MTJ film stack in a first dielectric layer;
    depositing a spin-orbit torque (SOT) induction wiring over the MTJ film stack;
    depositing a shared selector layer over the SOT induction wiring and coupling the shared selector layer to one end of the SOT induction wiring, the shared selector layer extending over and coupled to an adjacent second memory cell;
    coupling a source line to another end of the SOT induction wiring; and
    coupling a write word line to an upper side of the shared selector layer.

17. The method of claim 16, further comprising:
    performing a write operation to change a magnetic state of the MTJ film stack, the write operation passing a first current between the write word line and the source line, the first current passing through the shared selector layer and along a length of the SOT induction wiring adjacent to the MTJ film stack.

18. The method of claim 17, wherein the first current travels through a physical restriction of the SOT induction wiring.

19. The method of claim 17, wherein the first current travels through the shared selector layer transversely, and not to the adjacent second memory cell.

20. The method of claim 16, wherein a material of the shared selector layer comprises hafnium oxide ($HfO_x$, where $0<x\leq2$).

* * * * *